(12) United States Patent
Desclos

(10) Patent No.: US 12,745,679 B2
(45) Date of Patent: Sep. 22, 2026

(54) PACKAGE-ON-PACKAGE ASSEMBLY CONTAINING A DECOUPLING CAPACITOR

(71) Applicant: KYOCERA AVX Components Corporation, Fountain Inn, SC (US)

(72) Inventor: Laurent Desclos, San Diego, CA (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 271 days.

(21) Appl. No.: 18/494,815

(22) Filed: Oct. 26, 2023

(65) Prior Publication Data

US 2024/0145452 A1 May 2, 2024

Related U.S. Application Data

(60) Provisional application No. 63/420,748, filed on Oct. 31, 2022.

(51) Int. Cl.
*H10W 90/00* (2026.01)
*H10B 80/00* (2023.01)
(Continued)

(52) U.S. Cl.
CPC ............ *H10W 90/00* (2026.01); *H10B 80/00* (2023.02); *H10D 1/696* (2025.01);
(Continued)

(58) Field of Classification Search
None
See application file for complete search history.

(56) References Cited

U.S. PATENT DOCUMENTS

| | | | |
|---|---|---|---|
| 4,831,494 | A | 5/1989 | Arnold et al. |
| 5,583,738 | A | 12/1996 | Kohno |

(Continued)

FOREIGN PATENT DOCUMENTS

| | | | |
|---|---|---|---|
| EP | 2689455 B1 | 8/2016 |
| EP | 2614521 B1 | 1/2018 |

(Continued)

OTHER PUBLICATIONS

AVX, LGA Low Inductance Capacitors 0204/0306 Land Grid Array, p. 85-86.

(Continued)

*Primary Examiner* — Bilkis Jahan
(74) *Attorney, Agent, or Firm* — Dority & Manning, P.A.

(57) ABSTRACT

A microelectronic assembly comprising a first package comprising a first semiconductor structure electrically connected to a first package substrate and a second package electrically connected and disposed adjacent to the first package and that comprises a second semiconductor structure electrically connected to a second package substrate is provided. The assembly also comprises a decoupling capacitor that contains alternating dielectric layers and internal electrode layers, the internal electrode layers containing first internal electrode layers and second internal electrode layers. The capacitor further contains external terminals that are disposed on a first surface of the capacitor and electrically connected to the second package substrate and external terminals disposed on the second surface of the capacitor that are electrically connected to a circuit board.

33 Claims, 10 Drawing Sheets

(51) Int. Cl.
*H10D 1/68* (2025.01)
*H10W 44/00* (2026.01)
*H10W 70/685* (2026.01)

(52) U.S. Cl.
CPC ....... *H10W 44/601* (2026.01); *H10W 70/685* (2026.01); *H10W 90/724* (2026.01); *H10W 90/754* (2026.01)

(56) References Cited

U.S. PATENT DOCUMENTS 5,880,925 A 3/1999 DuPre et al.
6,034,864 A 3/2000 Naito et al.
6,075,285 A 6/2000 Taylor et al.
6,243,253 B1 6/2001 DuPre et al.
6,292,351 B1 9/2001 Ahiko et al.
6,407,907 B1 6/2002 Ahiko et al.
6,456,561 B2 9/2002 Maeda
6,459,561 B1 10/2002 Galvagni et al.
6,477,032 B2 11/2002 Makl, Jr.
6,496,355 B1 12/2002 Galvagni et al.
6,532,143 B2 3/2003 Figueroa et al.
6,594,136 B2 7/2003 Kuroda et al.
6,606,237 B1 8/2003 Naito et al.
6,664,628 B2 12/2003 Khandros et al.
6,752,152 B2 6/2004 Gale et al.
6,757,152 B2 6/2004 Galvagni et al.
6,795,294 B2 9/2004 Kuroda et al.
6,829,134 B2 12/2004 Yamauchi et al.
6,950,300 B2 9/2005 Sutardja
6,960,366 B2 11/2005 Ritter et al.
6,970,362 B1 11/2005 Chakravorty
7,068,490 B2 6/2006 Prymak
7,149,072 B2 12/2006 Lee et al.
7,170,737 B2 1/2007 MacNeal et al.
7,177,137 B2 2/2007 Ritter et al.
7,230,816 B2 6/2007 Sutardja
7,310,217 B2 12/2007 Takashima et al.
7,317,622 B2 1/2008 Li
7,414,857 B2 8/2008 Ritter et al.
7,417,857 B2 8/2008 Rondier et al.
7,463,474 B2 12/2008 Ritter et al.
7,545,623 B2 6/2009 Randall et al.
7,573,698 B2 8/2009 Eggerding et al.
7,576,968 B2 8/2009 Ritter et al.
7,633,739 B2 12/2009 Devoe
7,667,950 B2 2/2010 Togashi
7,697,262 B2 4/2010 Ritter et al.
7,701,695 B2 4/2010 Sutardja
7,715,171 B2 5/2010 Nakano et al.
7,724,496 B2 5/2010 Eggerding et al.
7,724,498 B2 5/2010 Mosley et al.
7,732,296 B2 6/2010 Park et al.
7,737,563 B2 6/2010 Su et al.
7,791,192 B1 9/2010 Joshi et al.
7,897,433 B2 3/2011 Su et al.
7,958,627 B2 6/2011 Randall et al.
7,961,453 B2 6/2011 Lee et al.
8,045,319 B2 10/2011 Ritter et al.
8,054,607 B2 11/2011 Lee et al.
8,084,297 B1 12/2011 Joshi et al.
8,111,524 B2 2/2012 Randall et al.
8,159,813 B2 4/2012 Lee et al.
8,193,039 B2 6/2012 Su et al.
8,203,198 B2 6/2012 Shioga et al.
8,238,116 B2 8/2012 Eggerding et al.
8,293,636 B2 10/2012 Schulze et al.
8,299,633 B2 10/2012 Su
8,338,961 B2 12/2012 Su et al.
8,394,672 B2 3/2013 Su et al.
8,446,705 B2 5/2013 Ritter et al.
8,451,014 B2 5/2013 Black et al.
8,472,190 B2 6/2013 Refai-Ahmed et al.
8,574,965 B2 11/2013 Refai-Ahmed et al.
8,624,404 B1 1/2014 Su et al.
8,647,974 B2 2/2014 Topacio et al.
8,691,626 B2 4/2014 Su et al.
8,704,353 B2 4/2014 Su et al.
8,717,774 B2 5/2014 Randall et al.
8,723,314 B2 5/2014 Su et al.
8,759,962 B2 6/2014 Su
8,796,842 B2 8/2014 Refai-Ahmed et al.
8,816,474 B2 8/2014 Hanke et al.
8,866,276 B2 10/2014 Su et al.
9,142,468 B2 9/2015 Bower et al.
9,177,724 B2 11/2015 Abe et al.
9,214,283 B2 12/2015 Togashi
9,385,055 B2 7/2016 Refai-Ahmed et al.
9,437,561 B2 9/2016 Black et al.
9,449,907 B2 9/2016 Fu et al.
9,524,826 B2 12/2016 Choi
9,613,755 B2 4/2017 Oh et al.
9,627,281 B2 4/2017 Prejean et al.
9,660,008 B2 5/2017 Bower et al.
9,793,239 B2 10/2017 Su et al.
9,806,014 B2 10/2017 Alfano et al.
9,960,146 B1 5/2018 Lin
9,997,467 B2 6/2018 Shao et al.
10,083,795 B2 9/2018 Itamura
10,163,735 B2 12/2018 Bower et al.
10,204,737 B2 2/2019 Ritter et al.
10,306,770 B2 5/2019 Hattori
10,418,331 B2 9/2019 Bower
10,424,438 B2 9/2019 Martinez et al.
10,490,540 B2 11/2019 Yu et al.
10,522,352 B2 12/2019 Delacruz et al.
10,593,618 B2 3/2020 Cheah et al.
10,621,387 B2 4/2020 Chhabra et al.
10,672,563 B2 6/2020 Cain
10,707,145 B2 7/2020 Bultitude et al.
10,832,912 B2 11/2020 Delacruz et al.
10,939,563 B2 3/2021 Silvano De Sousa
10,943,735 B2 3/2021 Horn et al.
10,943,869 B2 3/2021 Zhai et al.
11,121,074 B2 9/2021 Cheah et al.
11,257,785 B2 2/2022 Zhang et al.
11,296,043 B2 4/2022 Kung et al.
11,362,026 B2 6/2022 Kuo et al.
11,373,809 B2 6/2022 Berolini et al.
11,393,775 B2 7/2022 Hsieh et al.
11,636,978 B2 4/2023 Cain
11,721,488 B2 8/2023 Horn et al.
11,735,533 B2 8/2023 Mallik et al.
11,823,906 B2 11/2023 DeLaCruz et al.
11,837,405 B2 12/2023 Berolini et al.
11,848,160 B2 12/2023 Kobayashi et al.
12,074,118 B2 8/2024 Huang et al.
12,170,241 B2 12/2024 Kuo et al.
12,506,116 B2 12/2025 Lin et al.
2002/0024801 A1 2/2002 Hung et al.
2004/0042156 A1 3/2004 Devoe et al.
2004/0124511 A1 7/2004 Li
2004/0125539 A1 7/2004 Murakami et al.
2004/0125580 A1 7/2004 Chung et al.
2004/0136141 A1 7/2004 Korony et al.
2004/0184219 A1 9/2004 Otsuk et al.
2004/0223289 A1 11/2004 Kuroda et al.
2004/0257748 A1 12/2004 Ritter et al.
2005/0046536 A1 3/2005 Ritter et al.
2006/0049131 A1 3/2006 Satou
2007/0019364 A1 1/2007 Roy
2007/0025053 A1 2/2007 Akihiro
2007/0035014 A1 2/2007 Fung
2007/0096254 A1 5/2007 Ritter et al.
2007/0103846 A1 5/2007 Eggerding et al.
2007/0121275 A1 5/2007 Takashima et al.
2007/0133147 A1 6/2007 Ritter et al.
2007/0165361 A1 7/2007 Randall et al.
2007/0188975 A1 8/2007 Togashi et al.
2008/0049377 A1 2/2008 Sutardja
2008/0123247 A1 5/2008 Randall et al.
2008/0174934 A1 7/2008 Togashi
2008/0180879 A1 7/2008 Lee et al.

(56) References Cited

U.S. PATENT DOCUMENTS

2008/0186650 A1* 8/2008 Beker .................... H01G 4/232 29/832
2009/0002921 A1 1/2009 Ritter et al.
2009/0201624 A1 8/2009 Hattori et al.
2009/0244807 A1 10/2009 Lee et al.
2009/0284897 A1 11/2009 Itamura
2009/0291317 A1 11/2009 Kawasaki et al.
2010/0039749 A1 2/2010 Ritter et al.
2010/0188799 A1 7/2010 Galvagni et al.
2010/0232126 A1* 9/2010 Maeda .................. H01G 4/232 361/760
2010/0254070 A1 10/2010 Lee et al.
2011/0080683 A1 4/2011 Jones et al.
2011/0250791 A1 10/2011 Straka et al.
2013/0002388 A1 1/2013 Kim et al.
2013/0094157 A1 4/2013 Giuliano
2013/0201615 A1 8/2013 Arnold et al.
2013/0256913 A1 10/2013 Black et al.
2013/0321984 A1 12/2013 Masuda et al.
2014/0185264 A1 7/2014 Chen et al.
2014/0252544 A1 9/2014 Li et al.
2014/0293501 A1 10/2014 Jeong
2015/0014037 A1 1/2015 Ahn et al.
2015/0016016 A1 1/2015 Lee et al.
2015/0069623 A1 3/2015 Tsai et al.
2015/0229446 A1 8/2015 Feng
2015/0243438 A1 8/2015 Ahn et al.
2015/0243440 A1 8/2015 Gong et al.
2015/0294791 A1 10/2015 Hwang et al.
2015/0348711 A1 12/2015 Kim et al.
2016/0020025 A1 1/2016 Yao
2016/0027582 A1 1/2016 Ahn et al.
2016/0126013 A1 5/2016 Park et al.
2016/0142033 A1 5/2016 Chong et al.
2016/0150651 A1 5/2016 Tsai et al.
2016/0189864 A1 6/2016 Ritter et al.
2016/0240317 A1 8/2016 Ro
2016/0351335 A1 12/2016 Takahashi
2016/0351504 A1 12/2016 Teshima et al.
2016/0365335 A1 12/2016 Black et al.
2016/0381802 A1 12/2016 Taniguchi et al.
2017/0012029 A1 1/2017 Lambert et al.
2017/0047168 A1 2/2017 Lee et al.
2017/0048976 A1 2/2017 Prevatte et al.
2017/0103946 A1 4/2017 Chang et al.
2017/0263383 A1 9/2017 Kageyama et al.
2017/0309403 A1 10/2017 Park et al.
2018/0012702 A1 1/2018 Azuma et al.
2018/0090273 A1 3/2018 Hwang et al.
2018/0122580 A1 5/2018 Park et al.
2018/0130603 A1 5/2018 Chong et al.
2018/0158772 A1 6/2018 Tanaka
2018/0190580 A1 7/2018 Haba et al.
2018/0330880 A1 11/2018 Cain
2018/0330881 A1 11/2018 Cain
2018/0350753 A1 12/2018 Lee et al.
2018/0358292 A1 12/2018 Kong et al.
2019/0006104 A1* 1/2019 Cain .................... H01G 4/0085
2019/0080982 A1 3/2019 Bultitude et al.
2019/0312005 A1 10/2019 Pon et al.
2020/0075571 A1 3/2020 Chen et al.
2020/0082979 A1* 3/2020 Kim ...................... H05K 3/301
2020/0303127 A1 9/2020 Cain
2020/0350303 A1 11/2020 Sounart et al.
2021/0005547 A1 1/2021 Cheah et al.
2021/0066264 A1 3/2021 Huang et al.
2021/0159200 A1 5/2021 Lee
2021/0166993 A1 6/2021 Yen et al.
2021/0183755 A1 6/2021 Ong et al.
2021/0202393 A1 7/2021 Lu et al.
2021/0202395 A1 7/2021 Lu
2021/0202409 A1 7/2021 Kung et al.
2021/0210433 A1 7/2021 Liu
2021/0265115 A1 8/2021 Geum et al.
2021/0265280 A1 8/2021 Shih et al.
2021/0305192 A1 9/2021 Chu et al.
2021/0358859 A1 11/2021 Chen et al.
2021/0366884 A1 11/2021 Jung et al.
2021/0391271 A1 12/2021 Hsu et al.
2022/0013452 A1 1/2022 Kim et al.
2022/0020605 A1 1/2022 Essig et al.
2022/0020654 A1 1/2022 Cho et al.
2022/0028801 A1 1/2022 Tien et al.
2022/0028836 A1 1/2022 Wu et al.
2022/0037244 A1 2/2022 Tai et al.
2022/0037290 A1 2/2022 Yen et al.
2022/0052004 A1 2/2022 Lin
2022/0052013 A1 2/2022 Yen et al.
2022/0052024 A1 2/2022 Lu
2022/0059476 A1 2/2022 Collins et al.
2022/0068840 A1 3/2022 Cheng et al.
2022/0084958 A1 3/2022 Yang et al.
2022/0102453 A1 3/2022 Chen et al.
2022/0115288 A1 4/2022 Yen et al.
2022/0130776 A1 4/2022 Lu
2022/0157709 A1 5/2022 Shih et al.
2022/0157782 A1 5/2022 Zhai
2022/0181267 A1 6/2022 Kung et al.
2022/0181268 A1 6/2022 Kung et al.
2022/0199538 A1 6/2022 Lu
2022/0199552 A1 6/2022 Huang et al.
2022/0199559 A1 6/2022 Fang
2022/0208623 A1 6/2022 Lin et al.
2022/0230946 A1 7/2022 Shih et al.
2022/0230950 A1 7/2022 Chou
2022/0238457 A1 7/2022 Hsieh et al.
2022/0246533 A1 8/2022 Cho et al.
2022/0254699 A1 8/2022 Pi
2022/0262697 A1 8/2022 Fang
2022/0271019 A1 8/2022 Lin et al.
2023/0019800 A1 1/2023 Cain
2023/0144129 A1 5/2023 Yang et al.
2023/0307389 A1 9/2023 Kuo
2024/0128247 A1 4/2024 Marin et al.
2024/0145169 A1 5/2024 Berolini
2024/0145172 A1 5/2024 Berolini
2024/0145176 A1 5/2024 Berolini
2024/0145449 A1 5/2024 Desclos
2024/0145451 A1 5/2024 Desclos
2024/0145528 A1 5/2024 Desclos
2024/0145529 A1 5/2024 Desclos
2024/0265305 A1 8/2024 DeLaCruz et al.
2024/0363505 A1 10/2024 Kuo et al.
2024/0429157 A1 12/2024 Desclos
2024/0429182 A1 12/2024 Desclos

FOREIGN PATENT DOCUMENTS

JP 2004304159 A 10/2004
JP 2005039005 A 2/2005
JP 2005150283 6/2005
JP 2008022017 1/2008
JP 2008085054 A 4/2008
JP 2009081183 4/2009
JP 2010183025 8/2010
JP 2010199269 9/2010
JP 2018520507 A 7/2018
KR 20050089493 A 9/2005
KR 20070081537 A 8/2007
KR 101539884 B1 7/2015
KR 102387826 B1 4/2022
KR 102393946 B1 5/2022
WO WO 2024-097034 5/2024
WO WO 2024-097035 5/2024
WO WO 2024-097036 5/2024
WO WO 2024-097037 5/2024
WO WO 2024-097038 5/2024

OTHER PUBLICATIONS

AVX, Low Inductance Capacitors, p. 1-12, http://www.avxcorp.com.

(56) References Cited

OTHER PUBLICATIONS

Brown, Land Grid Array (LGA) Low Inductance Capacitor Advantages in Military and Aerospace Applications, 5 pages.
Cantlebary, AVX Corporation, Technical Information, LICA (Low Inductance Capacitor Array Flip-Chip Application Notes, 14 pages.
Kyocera AVX, Low Inductance Capacitors, Surface Mount Ceramic Capacitor Products, p. 75-78.
Lau, "Chiplet Heterogeneous Integration" Semiconductor Advanced Packaging, 2021, pp. 413-439 Feb. 15, 2024, 8 pages.
International Search Report and Written Opinion for PCT/US2023/035673 Mailed on Feb. 15, 2024, 8 pages.

* cited by examiner 125
10
110a
t
125
110b
125

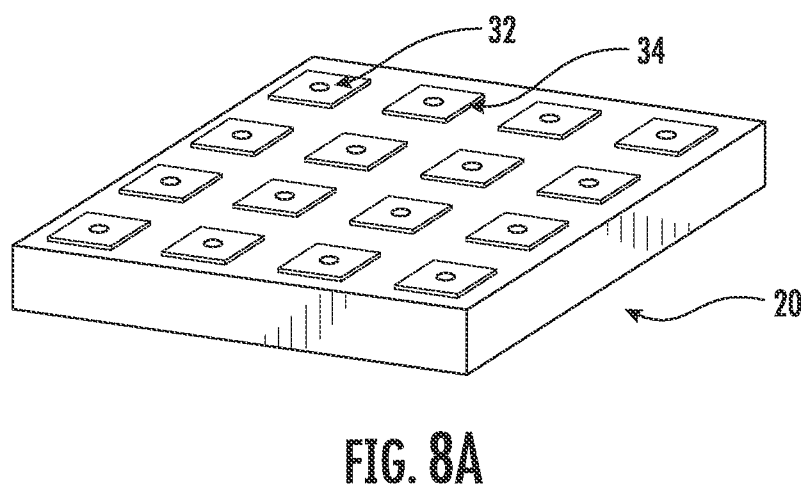
FIG. 8A
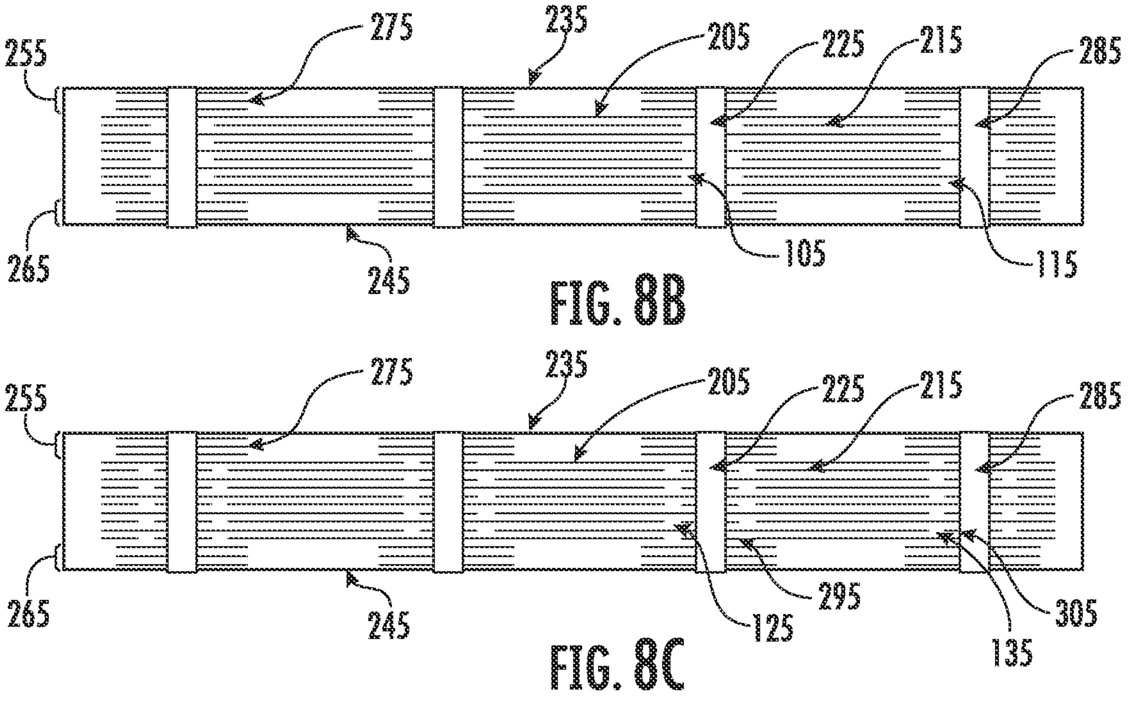
FIG. 8B
FIG. 8C

PACKAGE-ON-PACKAGE ASSEMBLY CONTAINING A DECOUPLING CAPACITOR

RELATED APPLICATION

The present application is based upon and claims priority to U.S. Provisional Patent Application Ser. No. 63/420,748, having a filing date of Oct. 31, 2022, which is incorporated herein by reference.

BACKGROUND OF THE INVENTION

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for shrinking electronic devices has grown, a need for smaller and more creative packaging techniques of semiconductor chips has emerged. To help perform high-density implementation of semiconductor chips, three-dimensional (3D) package-on-package solutions have been developed with flip chip interconnects (fcPoP). InFO-PoP is another 3D fan-out package-on-package assembly that integrates mobile AP w/DRAM package stacking for mobile applications. As part of the power delivery system to the chip, one or more decoupling capacitors are also typically employed so that any sudden requirement for current can be supplied to the chip with the voltage maintained constant or nearly constant. Unfortunately, however, increased switching speeds in chips have resulted in increased parasitic inductances. As such, a need currently exists for improved microelectronic assemblies that employ decoupling capacitors.

SUMMARY OF THE INVENTION

In accordance with one embodiment of the present invention, a microelectronic assembly is disclosed that comprises a first package comprising a first semiconductor structure that is electrically connected to a first package substrate and a second package that is electrically connected and disposed adjacent to the first package, wherein the second package comprises a second semiconductor structure that is electrically connected to a second package substrate. The microelectronic assembly also comprises a decoupling capacitor having a first surface and an opposing second surface, wherein the decoupling capacitor contains alternating dielectric layers and internal electrode layers. The internal electrode layers contain first internal electrode layers and second internal electrode layers. The capacitor further contains a first external terminal that is electrically connected to the first internal electrode layers and disposed on a first surface of the capacitor, a second external terminal that is electrically connected to the first internal electrode layers and disposed on the second surface of the capacitor, a third external terminal that is electrically connected to the second internal electrode layers and disposed on the first surface of the capacitor, and a fourth external terminal that is electrically connected to the second internal electrode layers and disposed on the second surface of the capacitor. The first external terminal and the third external terminal are electrically connected to the second package substrate, and the second external terminal and the fourth external terminal of the decoupling capacitor are electrically connected to a circuit board.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which:

FIG. 8A illustrates a perspective view of still another embodiment of a decoupling capacitor that may be employed in the present invention;

FIG. 8B illustrates a side perspective view of one configuration of the internal electrode layers of the capacitor of FIG. 8A; and FIG. 8C illustrates a side perspective view of another configuration of the internal electrode layers of the capacitor of FIG. 8A.

Figure 1:
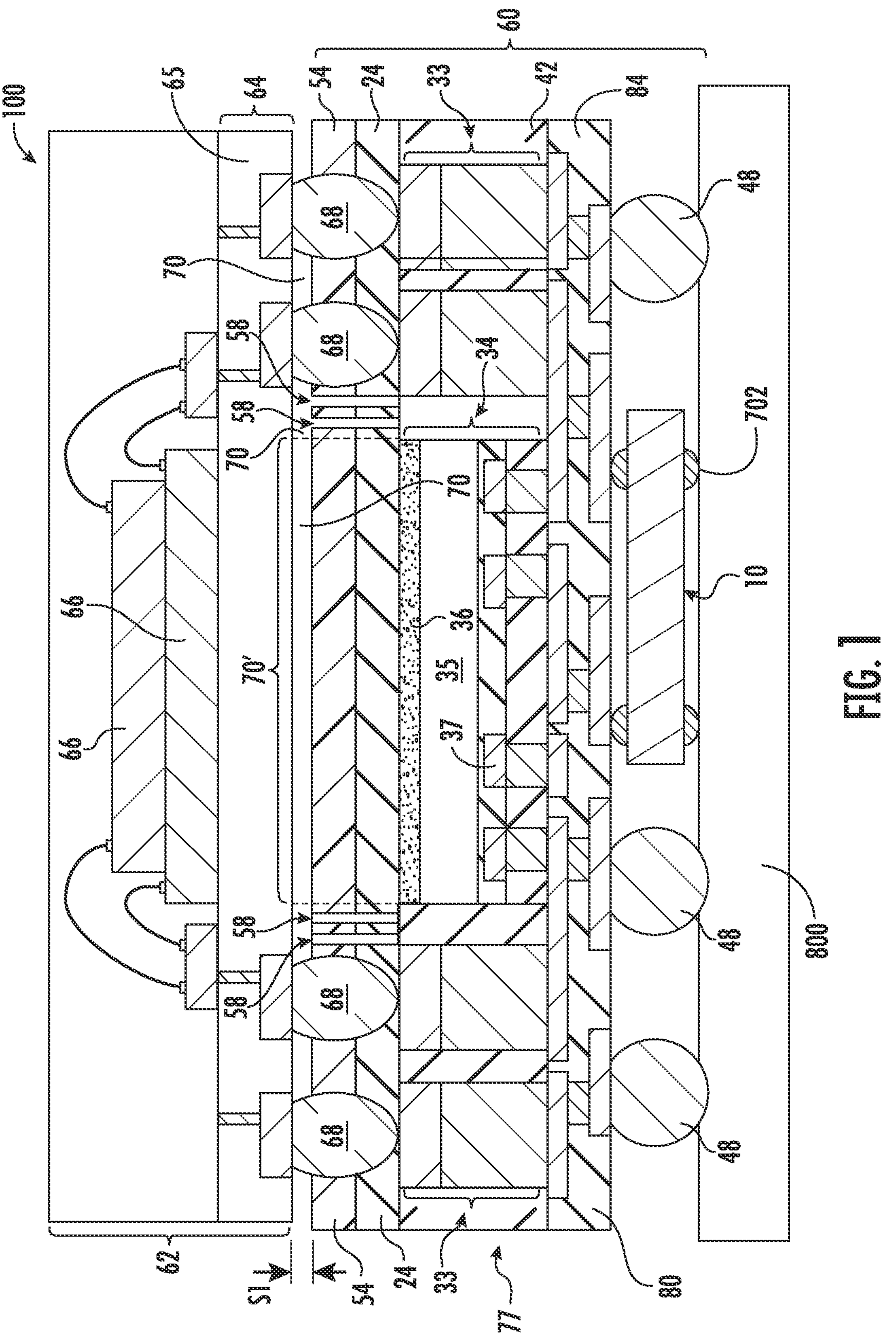
FIG. 1 a cross-sectional view of one embodiment of a microelectronic assembly of the present invention.

Repeat reference to characters in the present specification and figures is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only and is not intended as limiting the broader aspects of the present invention.

Generally speaking, the present invention is directed to a microelectronic assembly that includes a first package that is disposed adjacent to and electrically connected to a second package. The first package contains a first semiconductor structure electrically connected to a first package substrate and the second package contains a second semiconductor structure electrically connected to a second package substrate. Of course, one or more additional packages may also be employed. Regardless, the assembly further includes a decoupling capacitor having a first surface and an opposing second surface. The decoupling capacitor contains alternating dielectric layers and internal electrode layers, wherein the internal electrode layer includes first internal electrode layers and second internal electrode layers. A first external terminal is electrically connected to the first internal electrode layers and disposed on the first surface of the capacitor and a second external terminal is electrically connected to the first internal electrode layers and disposed on the second surface of the capacitor. Likewise, a third external terminal is electrically connected to the second internal electrode layers and disposed on a first surface of the capacitor and a fourth external terminal is electrically connected to the second internal electrode layers and disposed on the second surface of the capacitor. Typically, the first and second external terminals have the same polarity (e.g., positive) and the third and fourth external terminals have the same polarity (e.g., negative). Regardless, the first external terminal and the third external terminal of the decoupling capacitor are electrically connected to the second package substrate, and the second external terminal and the fourth external terminal of the decoupling capacitor are electrically connected to a circuit board (e.g., printed circuit board).

Various embodiments of the present invention will now be described in more detail below.

I. Semiconductor Structure

As indicated, the first package and the second package each contain one or more semiconductor structures (e.g., dies, wafers, integrated circuit devices, etc.). Generally speaking, a semiconductor structure may include an insulating material (e.g., a dielectric material formed in multiple layers, as known in the art) and multiple conductive pathways formed through the insulating material. The insulating material may include a dielectric material, such as silicon dioxide, silicon nitride, oxynitride, a polyimide material, a glass reinforced epoxy matrix material, or a low-k or ultra-low-k dielectric (e.g., a carbon-doped dielectric, a fluorine-doped dielectric, a porous dielectric, an organic polymeric dielectric, a photo-imagable dielectric, and/or a benzocyclobutene-based polymer). The insulating material may also include a semiconductor material, such as silicon, germanium, or a III-V material (e.g., gallium nitride), and one or more additional materials. For example, an insulating material may include silicon oxide or silicon nitride. The conductive pathways of a die may include conductive traces and/or conductive vias and may connect any of the conductive contacts in the die in any suitable manner. The semiconductor structure may include a mixed-pitch die (in the sense that the die has sets of conductive contacts with different pitch), for example, and the die may have "coarser" conductive contacts for coupling to the interposer of the microelectronic assembly. The structure may also include a single-sided die (only has conductive contacts on a single surface) and/or a double-sided die (conductive contacts on a first surface and on an opposing second surface). The conductive pathways in the dies may be bordered by liner materials, such as adhesion liners and/or barrier liners, as suitable. The semiconductor structure may also include a wafer. In some embodiments, the semiconductor structure includes a monolithic silicon, a fan-out or fan-in package die, or a die stack (e.g., wafer stacked, die stacked, or multi-layer die stacked).

The semiconductor structure may also have integrated circuit ("IC") structures such that it is in the form of a discrete IC device or "chip." Such an IC device may include one or more device layers disposed on a die substrate. The die substrate may be a semiconductor substrate composed of semiconductor material systems including, for example, n-type or p-type materials systems (or a combination of both). The die substrate may include, for example, a crystalline substrate formed using a bulk silicon or a silicon-on-insulator (SOI) substructure. In some embodiments, the die substrate may be formed using alternative materials, which may or may not be combined with silicon, that include, but are not limited to, germanium, indium antimonide, lead telluride, indium arsenide, indium phosphide, gallium arsenide, or gallium antimonide. Further, materials classified as group II-VI, III-V, or IV may also be used to form the die substrate. The device layers may include one or more transistors (e.g., metal oxide semiconductor field-effect transistors (MOSFETs)), supporting circuitry to route electrical signals to the transistors, passive components (e.g., signal traces, resistors, capacitors, or inductors), and/or any other IC components. The device layers may include, for example, one or more source and/or drain (S/D) regions, a gate to control current flow in the transistors between the S/D regions, and one or more S/D contacts to route electrical signals to/from the S/D regions. Each transistor may include a gate formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). Electrical signals, such as power and/or input/output (I/O) signals, may be routed to and/or from the devices (e.g., transistors) of the device layer through one or more interconnect layers disposed on the device layer. For example, electrically conductive features of the device layer (e.g., the gate and the S/D contacts) may be electrically coupled with the interconnect structures that may optionally form a metallization stack (also referred to as an "ILD stack") of the IC device. The interconnect structures may include lines and/or vias filled with an electrically conductive material, such as a metal. The lines may be arranged to route electrical signals in a direction of a plane that is substantially parallel with a surface of the die substrate upon which a device layer is formed. The vias may be arranged to route electrical signals in a direction of a plane that is substantially perpendicular to the surface of the die substrate upon which a device layer is formed.

The IC device may, for example, include a memory device (e.g., a random access memory (RAM) device, such as a static RAM (SRAM) device, a magnetic RAM (M RAM) device, a resistive RAM (RRAM) device, a conductive-bridging RAM (CBRAM) device, erasable-programmable read-only memory (EPROM) chip, a non-volatile memory (e.g., 3D XPoint), volatile memory (e.g., high bandwidth memory), stacked memory, etc.); logic device (e.g., an AND, OR, NAND, or NOR gate, programmable logic device, etc.); processor device (e.g., central processing unit (CPU), graphics processing unit (GPU), etc.); application-specific integrated circuits (ASIC), field programmable gate arrays (FPGA), platform controller hubs (PCH), and so forth, as well as any other suitable memory, logic, and/or processor device. Multiple devices may be combined on a single structure. For example, a memory array formed by multiple memory devices may be formed on a same die as a processing device or other logic that is configured to store information in the memory devices or execute instructions stored in the memory array.

The semiconductor structure may also be a "chiplet," which is a small integrated circuit (IC) that contains a well-defined subset of functionality that is one part of a processing module that makes up a larger integrated circuit like a computer processor. In some embodiments, one or more chiplets are variously coupled to the host chip, wherein each of the one or more chiplets includes a respective cache—e.g., including a last level cache (LLC), which is accessible to one or more cores of the host chip. The host chip may include one or more processor cores that can each operate as a consumer of memory resources, and the chiplet may include one or more memory arrays coupled to be accessible each by a respective processor core of host chip. In this particular context, the terms "memory," "memory array," "memory resource" and related terms generally refer to either of cache memory or non-cache memory (such as system memory, for example). Similarly, the term "memory controller" generally refers to controller circuitry that provides access to one of cache memory or non-cache memory. The host chip may contain a processor core that is to operate as a consumer of memory resources. For example, the host chip may execute an operating system, a binary input/output system (BIOS), and/or any of various other software processes. To facilitate execution of such software, a chiplet may include one or more memory arrays coupled to be accessible to processor core via a hardware interface. In one embodiment, the memory array includes static random access memory (SRAM) cells or dynamic random access memory (DRAM) cells. Additionally, or alternatively, the processor core may be coupled to cache data to memory array—e.g., wherein the processor core is coupled to access a last level cache (LLC) of memory array. In various other embodiments, the memory array may contain non-volatile memory (NVM) cells. The chiplet may also contain a memory controller coupled between the hardware interface and memory array to control memory access on behalf of a process which is executed with core. By providing the memory array in a chiplet disposed between hardware interface and host chip, the locality of data may be improved for use by one or more cores of packaged device. This improved data locality enables an access to memory resources which is relatively more space efficient, time efficient and/or power efficient.

The semiconductor(s) structures can be arranged in a two-dimensional configuration or array as is known in the art (e.g., 2D, 2.1D, 2.3D, or 2.5D heterogenous integration) or stacked into a 3D configuration. When employing a stacked configuration, the semiconductor structure may contain two or more semiconductor substrates (e.g., chips, interposers, etc.) mounted on a circuit board. If implemented as semiconductor chips, the substrates may be any of a myriad of different types of circuit devices used in electronics, such as, for example, microprocessors, graphics processors, combined microprocessor/graphics processors, application specific integrated circuits, memory devices or the like, and may be single or multi-core. The substrates may be constructed of bulk semiconductor, such as silicon or germanium, or semiconductor-on-insulator materials, such as silicon-on-insulator materials. The circuit board may be a semiconductor chip package substrate, a circuit card, or virtually any other type of printed circuit board. A monolithic structure could be used for the circuit board, although a more typical configuration will utilize a build-up design. In this regard, the circuit board may consist of a central core upon which one or more build-up layers are formed and below which an additional one or more build-up layers are formed. The core itself may consist of a stack of one or more layers. Electrical pathways between the substrates and the circuit board as well as between any of the substrates may be provided by interconnect structures.

II. Package Substrate

In addition to semiconductor structures, the first and second packages also include first and second package substrates to help bridge high density interconnects and functionality. The first and second package substrate may be the same or different. However, generally speaking, the package substrates include an insulating material and one or more conductive pathways through the insulating material (e.g., including conductive traces and/or conductive vias, as shown). The insulating material may include, for instance, organic materials, such as bismaleimide triazine ("BT") resin materials (e.g., BT, BT-epoxy resins, etc.), epoxy resin materials (e.g., glass fiber-reinforced epoxy resin (e.g., FR4)), polyimide materials, low-k and ultra-low-k dielectrics (e.g., carbon-doped dielectric, fluorine-doped dielectric, porous dielectric, and an organic polymeric dielectric). The insulating material may also be an inorganic material, such as those formed from ceramic materials (e.g., glass), as well as from semiconductor materials, such as silicon, germanium, and other group III-V (e.g., gallium nitride) and group IV materials.

The conductive pathways of the first package substrate may help couple the first package to the second package, while the conductive pathways of the second package substrate may help couple the second package to the circuit board and decoupling capacitor. Any suitable arrangement of conductive pathways through any suitable number of insulating layers may generally be employed. The conductive pathways may be made of any suitable conductive material, such as copper. The conductive pathways may be bordered by liner materials, such as adhesion liners and/or barrier liners, as suitable. In certain embodiments, the first package substrate may be a lower density medium, and the second package substrate may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

Although by no means required, the semiconductor structure(s) of one or more of the packages may be electrically connected to one or more interposers so that the resulting microelectronic assembly is considered a "chip-on-interposer" structure. Among other things, the interposer may provide an intervening substrate to help spread a connection to a wider pitch or reroute a connection to a different connection. In such embodiments, the semiconductor structure may be electrically connected to the interposer by one or more coupling components. The coupling components may electrically and mechanically couple the chip-on-interposer structure to the circuit board, and may include, for example, solder bumps, solder balls, male and female portions of a socket, adhesive, underfill material, and/or any other suitable electrical and/or mechanical coupling structure. The underfill material may be an insulating material, such as an appropriate epoxy material. When employed, an underfill material may include a capillary underfill, non-conductive film (NCF), or molded underfill. In some embodiments, the underfill material may include an epoxy flux that assists with soldering the semiconductor structure and then polymerizes and encapsulates the interconnects within the interposer. The interposer generally includes an insulating material, such as described above, and one or more conductive pathways through the insulating material (e.g., including conductive traces and/or conductive vias, as shown. Such pathways may include one or more metal interconnects and vias as is known in the art. In one embodiment, for example, the interposer may be formed from silicon and the vias may be formed therein may that are referred to as "through-silicon vias" ("TSVs").

When employed, an interposer may be passive or active depending on the particular embodiment. By "passive," it is generally meant the interposer is generally free of embedded electronic components. On the other hand, an "active" interposer generally contains one or more electronic components embedded within the insulating material. Examples of such electronic components may include, for instance, capacitors (e.g., decoupling capacitors), resistors, inductors, fuses, diodes, transformers, sensors, electrostatic discharge (ESD) devices, and memory devices. More complex devices such as radio frequency devices, power amplifiers, power management devices, antennas, and microelectromechanical systems (MEMS) devices, may also be formed in the interposer. For instance, an active interposer may include an active layer and a bulk semiconductor layer. The front surface of active layer may be referred to herein as an "active side" and the opposing surface of the bulk semiconductor layer may be referred to as a "backside." In one embodiment, the active layer may include one or more electronic components formed at the active side, such as level one (L1) memory elements used as memory caches for storing configuration bit streams for configuring logic sectors in a coprocessor. The active layer may optionally include decryption/decompression circuitry for processing encrypted and/or decompressed configuration bit streams. The semiconductor layer may include TSVs that connect electronic components (e.g., L1 memory elements) in the active layer to coupling elements (e.g., solder balls). For example, L1 caches may receive configuration bit streams from a host processor through solder balls and TSVs. In this manner, the energy efficiency of transferring signals and power between the active layer of the interposer and the package substrate may be improved.

III. Decoupling Capacitor

As indicated above, at least one decoupling capacitor is electrically connected to the second package substrate and a circuit board (e.g., printed circuit board). Generally speaking, the decoupling capacitor contains a main body that include alternating dielectric layers and internal electrode layers. The internal electrode layers include at least first internal electrode layers and second internal electrode layers. The capacitor may, for example, include at least two, such as at least three, such as at least four sets of internal electrode layers. Of course, it should be understood that the capacitor may include any number of sets of alternating dielectric layers and internal electrode layers and is not necessarily limited.

Typically, the capacitor includes an upper surface (e.g., first surface) and a lower surface (e.g., second surface) opposite the upper surface. The capacitor also includes at least one side surface, in particular at least two side surfaces, that extend between the upper surface and the lower surface. The capacitor may also include at least one end surface, in particular, at least two end surfaces, that extend between the upper surface and the lower surface. The side surfaces may extend in a length (L) direction and have a generally longer dimension than end surfaces that extend in a width (W) direction and have a generally shorter dimension. In one embodiment, the capacitor may have a parallelepiped shape, such as a rectangular parallelepiped shape. The overall dimensions of the capacitor may depend on the particular application. Typically, however, the height or thickness of the capacitor is from about 10 μm to about 5,000 μm, in some embodiments, from about 20 μm to about 2,500 μm, in some embodiments, from about 50 μm to about 1,500 μm, and in some embodiments, from about 100 μm to about 1,000 μm. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow. The length of the capacitor in the "L" direction may likewise be from about 50 μm to about 10,000 μm, in some embodiments, from about 100 μm to about 7,500 μm, and in some embodiments, from about 1,000 μm to about 5,000 μm and the width of the capacitor in the "W" direction may be from about 25 μm to about 5,000 μm, in some embodiments, from about 50 μm to about 3,500 μm, and in some embodiments, from about 500 μm to about 2,500 μm.

The first internal electrode layers and second internal electrode layers may be interleaved in an opposed and spaced apart relation with a dielectric layer located between each internal electrode layer. The respective sets of alternating dielectric layers and internal electrode layers may be separated from an adjacent set by a certain distance. For instance, that distance may be greater than the thickness of an individual dielectric layer in the set, such as at least 2, in some embodiments, at least 3, in some embodiments, at least 5, and in some embodiments, at least 10 times the thickness of a dielectric layer in the set. Each set of internal electrode layers and/or the entire capacitor may include from about 10 to about 4,000, in some embodiments, from about 50 to about 2,000, and in some embodiments, from about 100 to about 1,000 internal electrode layers. The thickness of the dielectric layers and/or internal electrode layers is not limited and can be any thickness as desired depending on the performance characteristics. For instance, the thickness of the internal electrode layers and/or individual dielectric layers may range from about 100 nm to about 10 μm, in some embodiments, from about 500 nm to about 8 μm, and in some embodiments, from about 1 μm to about 5 μm. In certain embodiments, if the capacitor includes a second set of alternating dielectric layers and internal electrode layers, the distance between the first internal electrode layer of one set and the last internal electrode layer of another set may be greater than the distance between adjacent internal electrode layers within a given set. For instance, the distance between the first internal electrode layer of a first set and the last internal electrode layer of a second set may be greater than the distance between the first internal electrode layer and the second internal electrode layer of the first set.

Although by no means required, dielectric regions of the decoupling capacitor may also include one or more voids. In this regard, the dielectric region may be a region that includes dielectric material but does not include the internal electrode material. The dielectric region may thus constitute a region that does not include alternatively arranged dielectric layers and internal electrode layers. Accordingly, the dielectric region may include the dielectric material between the respective sets of alternating dielectric layers and internal electrode layers in a "W" direction. In addition, the dielectric region may include the dielectric material between a lateral edge of the electrodes in a given set of alternating dielectric layers and internal electrode layers and an adjacent end surface in the longitudinal direction, for instance to the extent such internal electrode layers do not extend to the end surface such that they are offset from the end surface. It should be understood that while such dielectric regions may be formed from ceramic green sheets of alternating dielectric layers and internal electrode layers, such regions do not include any internal electrode material or corresponding layers. As a result, air voids may be provided within such regions. In addition, the dielectric regions may include the dielectric material present between the first internal electrode layer of the respective sets and an adjacent side surface of the capacitor. The dielectric regions may also include the dielectric material present between the last internal electrode layer of the respective sets and an adjacent side surface of the capacitor. The dielectric regions may also include the dielectric material between lateral edges of adjacent lead tabs that extend from the main body of the internal electrode layers. In one particular embodiment, the dielectric region may include the region within the capacitor present between two external terminals. In addition, it should be understood that the dielectric region may include a combination of any of the aforementioned regions.

As indicated above, the dielectric regions include those that include dielectric material but do not include the internal electrode material. Accordingly, not considering the air voids, the dielectric regions may include 90 vol. % or more, such as 93 vol. % or more, such as 95 vol. % or more, such as 97 vol. % or more, such as 98 vol. % or more, such as 99 vol. % or more, such as 100 vol. % of dielectric material. Such air voids may not include any material, in particular any dielectric material or internal electrode material. In one embodiment, the air voids may be enclosed, such as partially or completely, by an enclosure material. In one embodiment, the air voids may be partially enclosed by an enclosure material. By partially enclosed, the enclosure material is only partially present around the interior of the air void such that it is partially separated from the dielectric material. In this regard, at least a certain perimeter of the air void may be in direct contact with the dielectric material of the dielectric region. In another embodiment, the air voids may be completely or entirely enclosed by an enclosure material. By entirely enclosed, the enclosure material is present around the interior of the air void such that it is entirely separated from the dielectric material. Regardless, the enclosure material may be utilized to serve as a barrier between the interior of the air void and the dielectric material of the dielectric region. In one embodiment, the enclosure material may be a non-conductive material. However, it should be understood that in one embodiment, the air voids may not be enclosed, even partially, by an enclosure material.

The voids may be provided without any barrier between the air void and the dielectric material of the dielectric region. The air void may have any shape and is not necessarily limited. For instance, the shape may be a sphere, a cylinder, etc. In one embodiment, the shape may be a sphere. The air void may have a maximum dimension (e.g., length, width, diameter, etc.) of from about 5 μm to about 5,000 μm, in some embodiments, from about 50 μm to about 2,500 μm, and in some embodiments, from about 100 μm to about 1,000 μm. The voids may be formed using any known technique, such as by printing particular patterns in the ceramic green sheets and thereafter laminating and firing the stacked laminated. Alternately, the voids may be formed using various drilling techniques in order to provide any desired shape within the dielectric material of the dielectric region. The voids may also be presented using one or more vias (e.g., through-hole vias). The vias may be unfilled with material, such as any conductive or non-conductive material, such that air is present within the interior. In addition, in one embodiment, the vias may be provided such that they are only present within the dielectric region. In this regard, the vias may be provided that such that they do not contact any of the internal electrode layers. In one embodiment, the vias may extend from the upper surface of the capacitor to the lower surface of the capacitor. In this regard, the vias may be columnar extending through the thickness of the capacitor. Accordingly, the via may be a through hole conductive via. In another embodiment, the vias may only partially extend through the thickness of the capacitor. For instance, the vias may extend only partially through the capacitor thickness, such as from about 10% to about 90%, and in some embodiments, from about 20% to about 80% of the capacitor thickness.

In addition to alternating internal electrode layers and dielectric layers, the decoupling capacitor also includes a first external terminal that is electrically connected to the first internal electrode layers and disposed on a first surface of the capacitor (e.g., upper surface) and a second external terminal that is electrically connected to the first internal electrode layers and disposed on a second surface of the capacitor (e.g., lower surface). Likewise, a third external terminal is electrically connected to the second internal electrode layers and disposed on the first surface of the capacitor and a fourth external terminal is electrically connected to the second internal electrode layers and disposed on the second surface of the capacitor. Typically, the first and second external terminals have the same polarity (e.g., positive) and the third and fourth external terminals have the same polarity (e.g., negative). Regardless, the first external terminal and the third external terminal of the decoupling capacitor are electrically connected to the package substrate, and the second external terminal and the fourth external terminal of the decoupling capacitor are electrically connected to a printed circuit board.

The capacitor may also include external terminals on opposing end surfaces. For instance, one or more of the external terminals may extend from the first surface (e.g., upper surface) and/or second surface (e.g., lower surface) to an end surface. When present on the end surface, the external terminal may only be present partially on the end surface such that it does not cover the entire end surface. In another embodiment, the capacitor may not include any external terminals on opposing end surfaces. In one particular embodiment, the external terminals may not be present on a side surface of the capacitor. Regardless, the external terminals generally include at least one first polarity terminal and at least one second and opposite polarity terminal. The capacitors may include at least one, such as at least two, such as at least four, such as at least six, such as at least eight first polarity terminals and/or second and opposite polarity terminals on an upper surface of the capacitor. Additionally, the capacitors may include the aforementioned amounts of terminals on a lower surface of the capacitor.

The capacitors may include an equal number of first polarity terminals and/or second polarity terminals on the upper and lower surfaces of the capacitor. The number of first polarity terminals may equal the number of second and opposite polarity terminals on an upper surface of a capacitor. The number of first polarity terminals may equal the number of second and opposite polarity terminals on a lower surface of a capacitor. The total number of terminals present on an upper surface of the capacitor may equal to the total number of terminals present on a lower surface of the capacitor. The total number of first polarity terminals present on an upper surface and a lower surface of the capacitor may equal the total number of second and opposite polarity terminals present on an upper surface and a lower surface of the capacitor. Typically, the like polarity terminals on the lower surface of the capacitor that correspond to a particular set of alternating dielectric layers and internal electrode layers are electrically connected to the like polarity terminals on the upper surface of the capacitor. The like polarity terminals located on an upper surface and a lower surface of a capacitor may not be interdigitated. In this regard, corresponding like polarity terminals on an upper and a lower surface may not be offset by a terminal position but may instead be positioned directly above or below another like polarity terminal on the opposite upper or lower surface. In other words, corresponding like polarity terminals that correspond to a particular set of alternating dielectric layers and internal electrode layers, and in particular, corresponding lead tabs of such set, may be substantially aligned. By substantially aligned, it is meant that the offset from a side edge of one lateral edge of a polarity terminal on an upper surface is within +/−10%, such as within +/−5%, such as within +/−4%, such as within +/−3%, such as within +/−2%, such as within +/−1%, such as within +/−0.5% of the offset from a side edge of a corresponding polarity terminal on a lower surface.

The pitch (i.e., nominal distance between the centers; also referred to as center-to-center spacing) of the external terminals may be dictated by the particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals. The pitch may, for example, range from about 0.1 to about 2 mm, in some embodiments, from about 0.2 to about 1.5 mm, and in some embodiments, from about 0.4 to about 1.4 mm.

If desired, the external terminals may be positioned similar to the configuration of a ball-grid array. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array. In addition, like a ball-grid array, the external terminals may be provided in rows and columns. That is, the external terminals may be provided such that they exist in at least one row and at least two columns. For instance, the external terminals may be presented in at least two rows, such as at least three rows, such as at least four rows. The number of rows can be dictated by the number of different sets of alternating dielectric layers and internal electrode layers. In addition, the external terminals may be presented in at least two columns, such as at least three columns, such as at least four columns. The number of columns can be dictated by the number of different columnar tabs of the internal electrodes.

The length (i.e., extending in the longitudinal direction from an end surface to another end surface) of an external terminal extending along the upper surface may be the same as the length of a corresponding external terminal extending along the lower surface. For example, the length of an external terminal may be from about 0.3 to about 1.1 mm, in some embodiments, from about 0.4 to about 1 mm, and in some embodiments, from about 0.5 to about 0.9 mm. The length of an external terminal may also be less than the length of the capacitor, such as 50% or less, such as 40% or less, such as 30% or less, such as 25% or less, such as 20% or less, such as 15% or less the length of the capacitor. If desired, each external terminal may have a different length. For instance, the external terminal adjacent an end surface may have a length greater than the external terminal offset from the end surface. In this regard, the ratio of the length of the external terminal adjacent an end surface to the length of the external terminal offset from the end surface may be from about 0.3 to about 5, in some embodiments, from about 0.5 to about 4, and in some embodiments, from about 0.7 to about 3. The width of an external terminal extending from a side surface to an opposing side surface may be same on the upper surface and the lower surface. For instance, the width may range from about 0.3 to about 1.1 mm, in some embodiments, from about 0.4 to about 1 mm, and in some embodiments, from about 0.5 to about 0.9 mm.

Figure 2A:
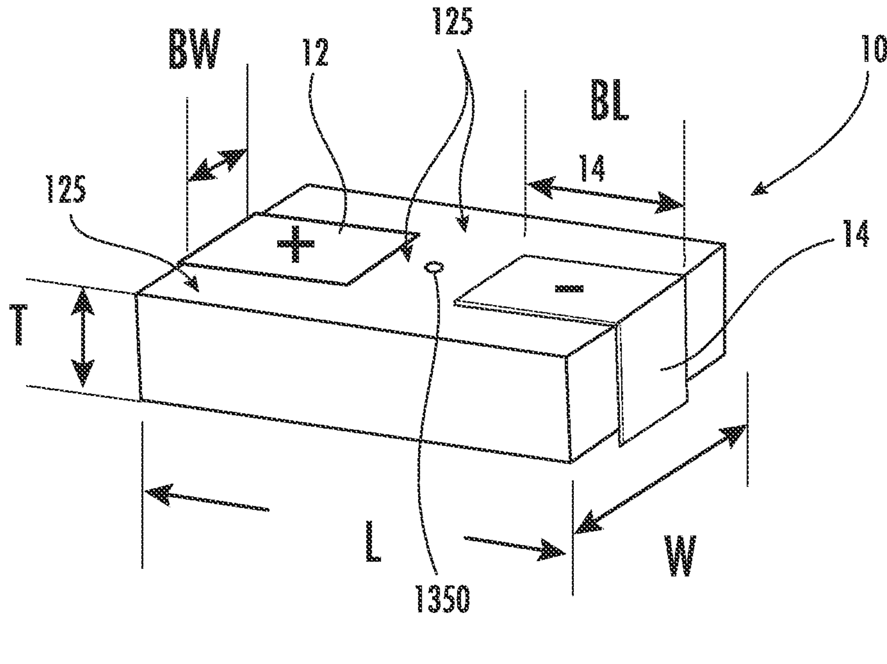
FIG. 2A illustrates a perspective view of one embodiment of a decoupling capacitor that may be employed in the present invention.
Figure 2B:
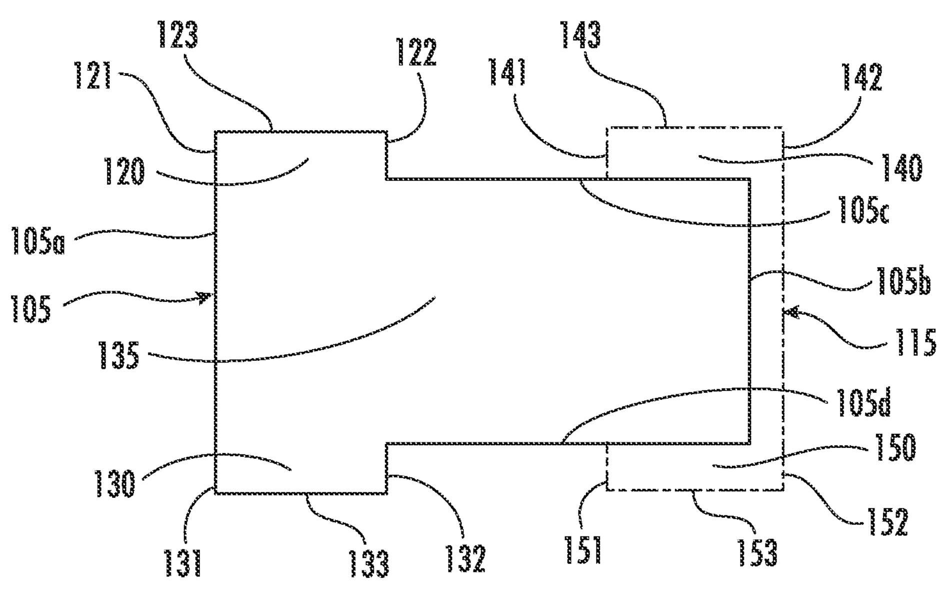
FIG. 2B illustrates a side view of the internal electrode layers of the capacitor of FIG. 2A.

Referring to FIGS. 2A-2B, one particular embodiment of a decoupling capacitor 10 that can be employed in the microelectronic assembly of the present invention is shown in more detail. The capacitor 10 generally has a thickness "T", width "W", and length "L" such as described above. Further, as shown, the capacitor 10 has a 1×2 configuration in that it includes two external terminals along one dimension of the upper surface and the lower surface. Namely, the capacitor 10 includes a first external terminal 12 and a second external terminal 14 on an upper surface and two corresponding third and fourth external terminals, respectively, (not shown) on a lower surface. The first external terminal 12 and the third external terminal (not shown) may have the same polarity (i.e., positive), and the second external terminal 14 and fourth external terminal (not shown) may also have the same polarity (i.e., negative). The width "BW" and length "BL" of the external terminals 12 and/or 14 may be within the ranges discussed above. Although by no means required, a void 1350 may also be formed in the capacitor 10 between the terminals 12 and 14 as described above.

The capacitor 10 also includes dielectric layers (not shown) and internal electrode layers 110, as illustrated in FIG. 2B. Namely, the internal electrode layers 110 includes first internal electrode layers 105 and second internal electrode layers 115. In the particular embodiment shown, the internal electrode layers 105, 115 include at least one lead tab 120, 130, 140, 150 extending from a top edge and a bottom edge of the main body of the internal electrode layers. The lead tabs 120, 130, 140, 150 of the internal electrode layers 105, 115 may extend to the upper surface and the lower surface of the capacitor and assist in forming the external terminals. In this regard, the lead tabs 120, 130, 140, 150 may be exposed on the upper surface and the lower surface of the capacitor and allow for connection between the main body of the internal electrode layers and the external terminals. For instance, the lead tabs 120, 130, 140, 150 may contain leading edges 123, 133, 143, 153 that extend to an edge of a dielectric layer and allow for formation of the external terminals. The length of the lead tabs 120, 130, 140, 150 may vary as desired, but is typically from about 0.3 to about 1.2 mm, in some embodiments, from about 0.4 to about 1.1 mm, and in some embodiments, from about 0.5 to about 1 mm. When more than one lead tab is present along an edge, each lead tab may have the same length. In another embodiment, each lead tab may have a different length. For instance, the lead tab substantially aligned with the side edge of the internal electrode layer may have a length greater than the lead tab offset from the side edges of the internal electrode layer. In this regard, the ratio of the length of the lead tab aligned with the side edge of the internal electrode layer to the length of the lead tab offset from the side edges of the internal electrode layer may range from about 0.3 to about 5, in some embodiments, from about 0.5 to about 4, and in some embodiments, from about 0.7 to about 3. By being substantially aligned, it is generally meant that the offset from a side edge of one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge of a corresponding lateral edge of a first lead tab and/or second lead tab on a bottom edge.

As illustrated in FIG. 2B, a first internal electrode layer 105 includes one lead tab 120, 130 along a top edge 105*c* and a bottom edge 105*d* and extending from main body 135. A second internal electrode layer 115 includes one lead tab 140, 150 along a top edge and a bottom edge and extending from main body 135. The lead tabs 120, 130 on the top edge and the bottom edge of first internal electrode layer 105 may be aligned in the vertical direction. That is, a lateral edge 121, 122 of a first lead tab 120 along a top edge 105*c* may be aligned with a lateral edge 131, 132 of a first lead tab 130 along a bottom edge 105*d* opposite the top edge 105*c*. In addition, such lateral edges 121, 131 may be aligned with the side edge 105*a* of the internal electrode layer 105. However, it should be understood that both lateral edges 121, 122 of the first lead tab 120 along a top edge 105*c* may be aligned with the lateral edges 131, 132 of a first lead tab 130 along a bottom edge 105*d* opposite the top edge 105*c*. In other words, both lateral edges 122, 132 may be aligned and offset from the side edges 105*a-b* the same distance along a bottom edge 105*d* and the top edge 105*c*. Similarly, the lead tabs 140, 150 on the top edge and the bottom edge of second internal electrode layer 115 may be aligned in the vertical direction. That is, a lateral edge 141, 142 of a first lead tab 140 along a top edge may be aligned with a lateral edge 151, 152 of a first lead tab 150 along a bottom edge opposite the top edge. In one embodiment, both lateral edges 141, 142 of the first lead tab 140 along a top edge may be aligned with the lateral edges 151, 152 of a first lead tab 150 along a bottom edge opposite the top edge. The relationship between lateral edges of a first lead tab on a top edge and a first lead tab on a bottom edge as mentioned with respect to internal electrode layer 105 may also apply to internal electrode layer 115. With such arrangement, a gap may be formed between lead tab 120 of the first internal electrode layer 105 and lead tab 140 of the second internal electrode layer 115. Similarly, a gap may be formed between lead tab 130 of the first internal electrode layer 105 and lead tab 150 of the second internal electrode layer 115. The size of each respective gap may be substantially the same.

The lead tabs 120 and 140 may be arranged in parallel with lead tabs 130 and 150, respectively, extending from the internal electrode layers 105 and 115 such that the lead tabs extending from alternating electrode layers 105 and 115 may be aligned in a respective column. For instance, lead tabs 120 and 130 of internal electrode layer 105 may be arranged in a respective stacked configuration while lead tabs 140 and 150 of internal electrode layer 115 may be arranged in a respective stacked configuration.

It will be appreciated that lead tabs 120 connect to external terminal 12 while lead tabs 140 connect to external terminal 14. Accordingly, respective lead tabs 120 will be interdigitated with respective lead tabs 140 in a manner similar to external terminals 12 and 14. The interdigitated lead tabs can provide multiple, adjacent current injection points onto the associated main electrode portions.

The distance between adjacent exposed lead tabs of the internal electrode layers in a given column may be specifically designed to help ensure guided formation of terminations. The distance between exposed lead tabs of the internal electrode layers in a given column may, for example, range from about 0.25 to about 10 μm, in some embodiments, from about 0.5 to about 5 μm, and in some embodiments, from about 1 to about 4 μm. Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization may be about 4× the distance between adjacent exposed electrode tabs in a particular stack. However, such distance may vary depending on the desired capacitance performance and circuit board configuration. For example, the distance may be from about 0.1 to about 1.5 mm, in some embodiments, from about 0.2 to about 1.3 mm, and in some embodiments, from about 0.3 to about 1 mm, as determined based on the center-point of each lead tab or based on the distance between adjacent lateral edges of the lead tabs. In addition, such distance may correspond to the separation distance of the ball on a ball grid array.

Figure 3A:
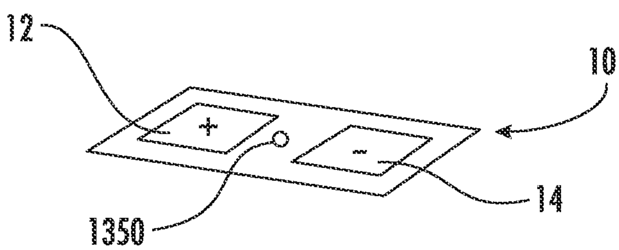
FIG. 3A illustrates a perspective view of another embodiment of a decoupling capacitor that may be employed in the present invention.
Figure 3B:
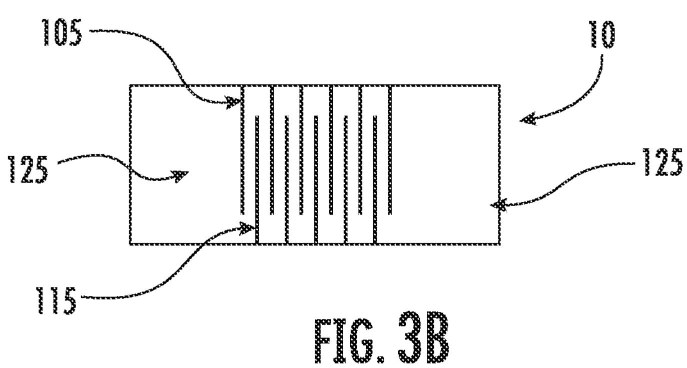
FIG. 3B illustrates an end view of the capacitor of FIG. 3A.
Figure 3C:
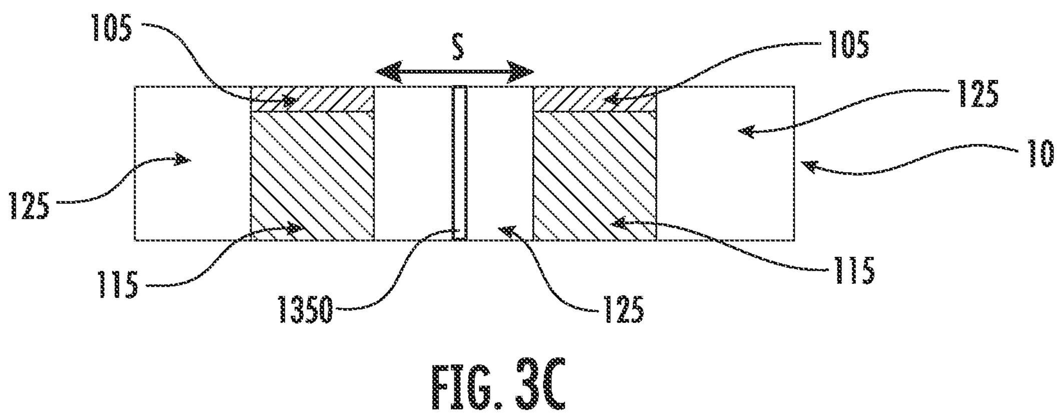
FIG. 3C illustrates a side view of the capacitor of FIG. 3A.

In the embodiments illustrated in FIGS. 2A-2B, the capacitor contains two external terminals that extend to ends of the capacitor. However, this is by no means required. Referring to FIGS. 3A-3C, for example, one embodiment of a capacitor 10 is shown in which the first external terminal 12, second external terminal 14, as well as the third and fourth external terminals (not shown) do not extend to an end of the capacitor. To help accomplish such a configuration in this particular embodiment, the capacitor 10 contains internal electrode layers 110 containing first internal electrode layers 105 and second internal electrode layers 115. The first internal electrode layers 105 may extend to an upper surface of the capacitor 10, and the second internal electrode layers 115 extend to a lower surface of the capacitor. The extensions assist in the formation of the external terminals. In this regard, the internal electrode layers may be exposed on the upper surface and the lower surface of the capacitor and allow for connection between the main body of the internal electrode layers and the external terminals. For instance, internal electrode layers 105, 115 extend to an edge of a dielectric layer and allow for formation of the external terminals. The lateral or sides edges of the internal electrode layers 105, 115 may be aligned in the vertical direction. That is, a lateral edge of a first internal electrode layer 105 may be aligned with a lateral edge of a second internal electrode layer 115. In one embodiment, both lateral edges may be aligned. In another embodiment, the point of contact of a first internal electrode layer 105 with an external terminal may be aligned with the point of contact of a second internal electrode layer 115 with an external terminal. Additionally, the capacitor 10 of FIG. 3A includes at least one first polarity terminal and at least one second and opposite polarity terminal on an upper surface. Although not shown, the lower surface includes at least a first polarity terminal and a second and opposite terminal.

Figure 4A:
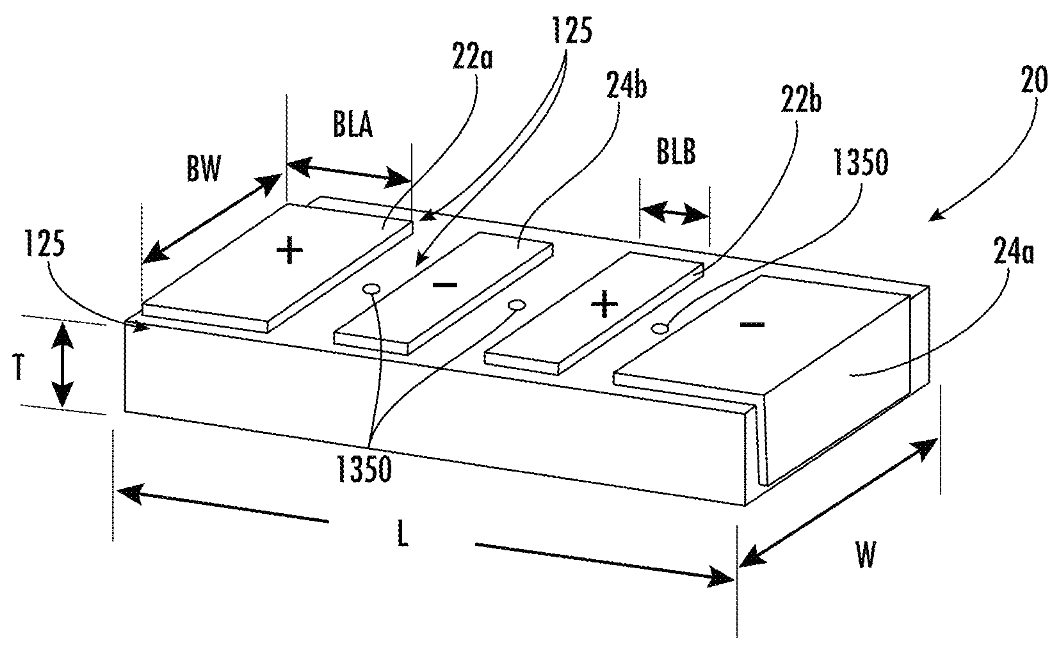
FIG. 4A illustrates a perspective view of another embodiment of a decoupling capacitor that may be employed in the present invention.
Figure 4B:
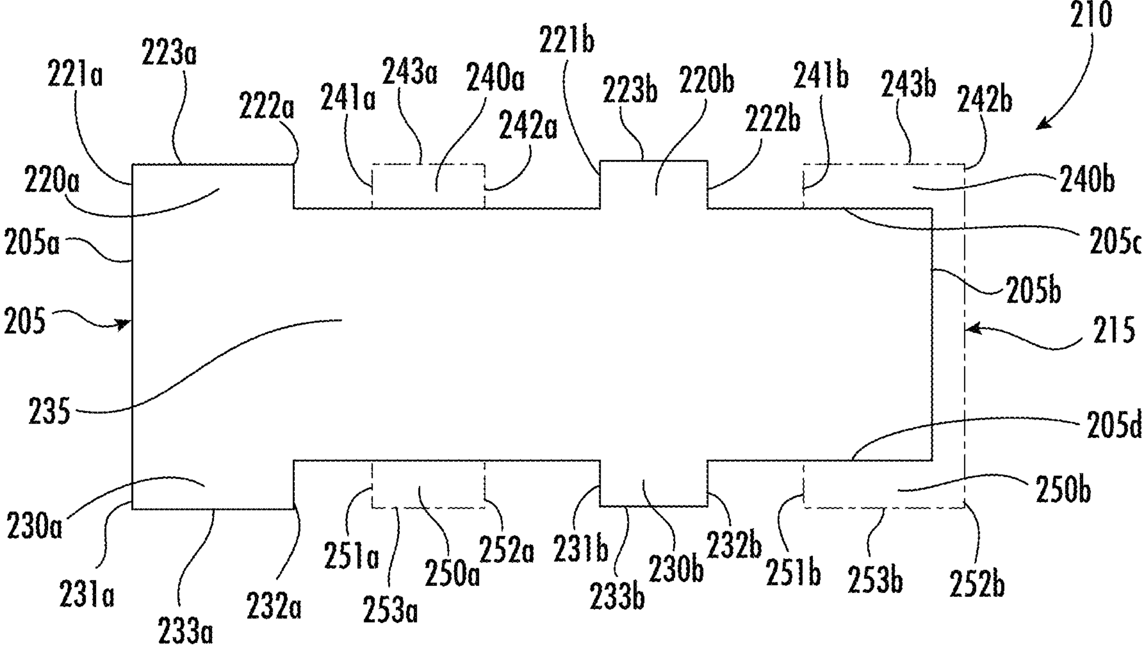
FIG. 4B illustrates a side view of the internal electrode layers of the capacitor of FIG. 4A.

In the embodiments illustrated in FIGS. 2A-2B and 3A-3C, the capacitor contains two external terminals on each surface. However, as indicated above, the present invention is not limited by the number of external terminals and/or the number of lead tabs extending from a top edge and/or bottom edge. Referring to FIGS. 4A and 4B, for instance, a capacitor 20 is shown that has a 1×4 array configuration and thus contains four external terminals on each surface. That is, the capacitor includes four terminals along two dimensions of the upper surface and the lower surface. In this regard, the capacitor includes a total of four external terminals on an upper surface—i.e., first external terminals 22*a* and 22*b* and second external terminals 24*a* and 24*b*, as well as corresponding sets of third and fourth external terminals (not shown) on a lower surface. The first external terminals 22*a*, 22*b* and third external terminals (not shown) generally have the same polarity (i.e., positive), and the second external terminals 24*a*, 24*b* and fourth external terminals (not shown) also generally have the same polarity (i.e., negative). The capacitor 20 also generally has a thickness "T", width "W", and length "L" such as described above, and the width "BW" and lengths "BLA" and "BLB" of the external terminals 22*a*, 22*b* and/or 24*a*, 24*b* may be within the ranges discussed above. Although by no means required, voids 1350 may also be formed in the capacitor 20 between the external terminals 22*a*, 24*b*, 22*b*, and/or 24*a* as described above.

The capacitor 20 also includes internal electrode layers 210 containing first internal electrode layers 205 and second internal electrode layers 215 in an alternating arrangement. The internal electrode layers 205, 215 include at least one lead tab 220*a-b*, 230*a-b*, 240*a-b*, 250*a-b* extending from a top edge and a bottom edge of the main body of the internal electrode layers. The lead tabs 220*a-b*, 230*a-b*, 240*a-b*, 250*a-b* of the internal electrode layers 205, 215 extend to the upper surface and the lower surface of the capacitor and assist in forming the external terminals. In this regard, the lead tabs 220*a-b*, 230*a-b*, 240*a-b*, 250*a-b* may be exposed on the upper surface and the lower surface of the capacitor and allow for connection between the main body of the internal electrode layers and the external terminals. For instance, lead tabs 220*a-b*, 230*a-b*, 240*a-b*, 250*a-b* may contain leading edges 223*a-b*, 233*a-b*, 243*a-b*, 253*a-b* that extend to an edge of a dielectric layer and allows for formation of the external terminals. The internal electrode layers 205, 215 include at least two lead tabs 220*a-b*, 230*a-b*, 240*a-b*, 250*a-b* along a top edge and a bottom edge. A first internal electrode layer 205 includes two lead tabs 220*a-b*, 230*a-b* along each top edge 205*c* and bottom edge 205*d* and extending from main body 235. A second internal electrode layer 215 includes two lead tabs 240*a-b*, 250*a-b* along each top edge bottom edge and extending from main body 235.

The lead tabs 220*a-b*, 230*a-b* on the top edge 205*c* and the bottom edge 205*d* of first internal electrode layer 205 may be aligned in the vertical direction. That is, a lateral edge 221*a*, 222*a* of a first lead tab 220 along a top edge 205*c* may be aligned with a lateral edge 231*a*, 232*a* of a first lead tab 230 along a bottom edge 205*d* opposite the top edge 205*c*. In addition, such lateral edges 221*a*, 231*a* may be aligned with the side edge 205*a* of the internal electrode layer 205. However, it should be understood that both lateral edges 221*a*, 222*a* of the first lead tab 220*a* along a top edge 205*c* may be aligned with the lateral edges 231*a*, 232*a* of a first lead tab 230*a* along a bottom edge 205*d* opposite the top edge 205*c*. In other words, both lateral edges 222*a*, 232*a* may be offset from the side edges 205*a-b* the same distance along a bottom edge 205*d* and the top edge 205*c*. When a top edge 205*c* and a bottom edge 205*d* contain at least two lead tabs 220*a-b*, 230*a-b*, at least one lateral edge of each lead tab on a top edge 205*c* may be aligned with a corresponding lateral edge of a lead tab on the bottom edge 205*d*. Also, both lateral edges of each lead tab on a top edge 205*c* may be aligned with corresponding lateral edges of the lead tabs on the bottom edge 205*d*. Similarly, the lead tabs 240*a-b*, 250*a-b* on the top edge and the bottom edge of second internal electrode layer 215 may be aligned in the vertical direction. That is, a lateral edge 241*a*, 242*a* of a first lead tab 240 along a top edge may be aligned with a lateral edge 251*a*, 252*a* of a first lead tab 250 along a bottom edge opposite the top edge.

Both lateral edges 241*a*, 242*a* of the first lead tab 240*a* along a top edge may be aligned with the lateral edges 251*a*, 252*a* of a first lead tab 250*a* along a bottom edge opposite the top edge. The relationship between lateral edges of a first lead tab on a top edge and a first lead tab on a bottom edge as mentioned with respect to internal electrode layer 205 may also apply to internal electrode layer 215. With such an arrangement, a gap may be formed between any of the lead tabs along a top edge 205*c* of first internal electrode layer 205, of second internal electrode layer 215, or both. For instance, a gap may be formed between any of lead tabs 220*a-b*, 240*a-b* that extend from the top edges of the respective internal electrode layers. Additionally, a gap may be formed between any of the lead tabs along a bottom edge 205*d* of first internal electrode layer 205, of second internal electrode layer 215, or both. For instance, a gap may be formed between any of lead tabs 230*a-b*, 250*a-b* that extend from the bottom edges of the respective internal electrode layers. Also, the size of a gap between two respective tabs that extend from a top edge, whether from the same internal electrode layer or adjacent internal electrode layers, may be substantially the same as the size of a gap between the corresponding two respective tabs that extend from a bottom edge. For example, the gap between lead tabs 220*a* and 220*b* may be substantially the same as the gap between lead tabs 230*a* and 230*b*. Similarly, the gap between lead tabs 220*a* and 240*a* may be substantially the same as the gap between lead tabs 230*a* and 250*a*.

Any or all of lead tabs 220*a-b*, 240*a-b* may be arranged in parallel with lead tabs 230*a-b*, 250*a-b*, respectively, extending from the layers 205 and 215 such that the lead extending from alternating electrode layers 205 and 215 may be aligned in a respective column. For instance, lead tabs 220*a-b* and 230*a-b* of internal electrode layer 205 may be arranged in a respective stacked configuration while lead tabs 240*a-b* and 250*a-b* of internal electrode layer 215 may be arranged in a respective stacked configuration. It will be appreciated that lead tabs 220*a-b* connect to external terminals 22*a-b*, respectively, while lead tabs 240*a-b* connect to external terminal 24*a-b*, respectively. Accordingly, respective lead tabs 220*a-b* will be interdigitated with respective lead tabs 240*a-b*, respectively, in a manner similar to external terminals 22*a-b* and 24*a-b*. The interdigitated lead tabs can provide multiple, adjacent current injection points onto the associated main electrode portions.

In the embodiments discussed above, the external terminals are arranged in a linear fashion (e.g., 1×2 or 1×4 configuration) in a single dimension. Of course, it should be understood that multi-dimensional arrays of external terminals may also be employed. Referring to FIGS. 5A-5D, for instance, one particular embodiment of a capacitor 10 is shown that has a 2×2 array configuration. In such a configuration, the capacitor includes a total of four external terminals on the upper surface (first external terminals 12 and second external terminals 14) and a corresponding number of external terminals (third and fourth external terminals, not shown) on the lower surface. The first external terminals 12 and third external terminals (not shown) generally have the same polarity (i.e., positive), and the second external terminals 14 and fourth external terminals (not shown) also generally have the same polarity (i.e., negative). Although by no means required, void 1350 may also be formed in the capacitor 10 between the external terminals 12 and 14 as described above.

The capacitor 10 includes alternating dielectric layers and internal electrode layers 110 that include first internal electrode layers 105 and second internal electrode layers 115 in an alternating arrangement. Similar to the embodiment discussed above in FIGS. 2A-2B, the internal electrode layers 105, 115 also include at least one lead tab 120, 130, 140, 150 extending from a top edge and a bottom edge of the main body of the internal electrode layers. However, contrary to the internal electrodes of FIGS. 2A-2B, a lateral edge 121, 122 of a first lead tab 120 along a top edge 105*c* may be aligned with a lateral edge 131, 132 of a first lead tab 130 along a bottom edge 105*d* opposite the top edge 105*c*. In other words, a lateral edge 121, 122 of a first lead tab 120 along a top edge 105*c* may be offset (indicated by "O") from a side edge 105*a-b* the same distance as a lateral edge 131, 132 of a first lead tab 130 along a bottom edge 105*d* opposite the top edge 105*c*. However, it should be understood that both lateral edges 121, 122 of the first lead tab 120 along a top edge 105*c* may be aligned with the lateral edges 131, 132 of a first lead tab 130 along a bottom edge 105*d* opposite the top edge 105*c*. In other words, both lateral edges 121, 122 of a first lead tab 120 along a top edge 105*c* may be offset from a side edge 105*a-b* the same distance as both lateral edges 131, 132 of a first lead tab 130 along a bottom edge 105*d* opposite the top edge 105*c*.

Similarly, the lead tabs 140, 150 on the top edge and the bottom edge of second internal electrode layer 115 may be aligned in the vertical direction. That is, a lateral edge 141, 142 of a first lead tab 140 along a top edge may be aligned with a lateral edge 151, 152 of a first lead tab 150 along a bottom edge opposite the top edge. In one embodiment, both lateral edges 141, 142 of the first lead tab 140 along a top edge may be aligned with the lateral edges 151, 152 of a first lead tab 150 along a bottom edge opposite the top edge. The relationship between lateral edges of a first lead tab on a top edge and a first lead tab on a bottom edge as mentioned with respect to internal electrode layer 105 may also apply to internal electrode layer 115. With such arrangement a gap may be formed between lead tab 120 of the first internal electrode layer 105 and lead tab 140 of the second internal electrode layer 115. A gap may be formed between lead tab 130 of the first internal electrode layer 105 and lead tab 150 of the second internal electrode layer 115. The size of each respective gap may be substantially the same.

The lead tabs 120 and 140 may be arranged in parallel with lead tabs 130 and 150, respectively, extending from the internal electrode layers 105 and 115 such that the lead tabs extending from alternating electrode layers 105 and 115 may be aligned in a respective column. For instance, lead tabs 120 and 130 of internal electrode layer 105 may be arranged in a respective stacked configuration while lead tabs 140 and 150 of internal electrode layer 115 may be arranged in a respective stacked configuration. It will be appreciated that lead tabs 120 connect to external terminal 12 while lead tabs 140 connect to external terminal 14. Accordingly, respective lead tabs 120 will be interdigitated with respective lead tabs 140 in a manner similar to external terminals 12 and 14. The interdigitated lead tabs can provide multiple, adjacent current injection points onto the associated main electrode portions.

Figure 5A:
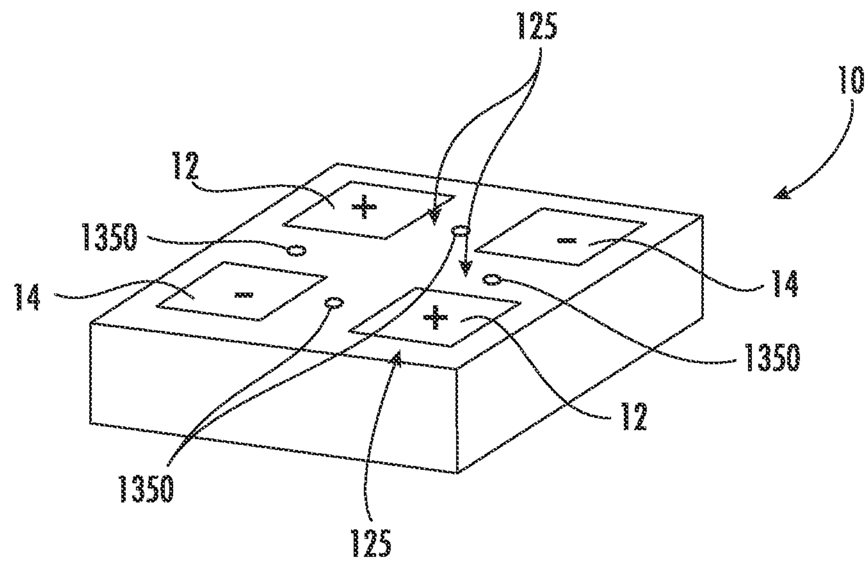
FIG. 5A illustrates a perspective view of another embodiment of a decoupling capacitor that may be employed in the present invention.
Figure 5B:
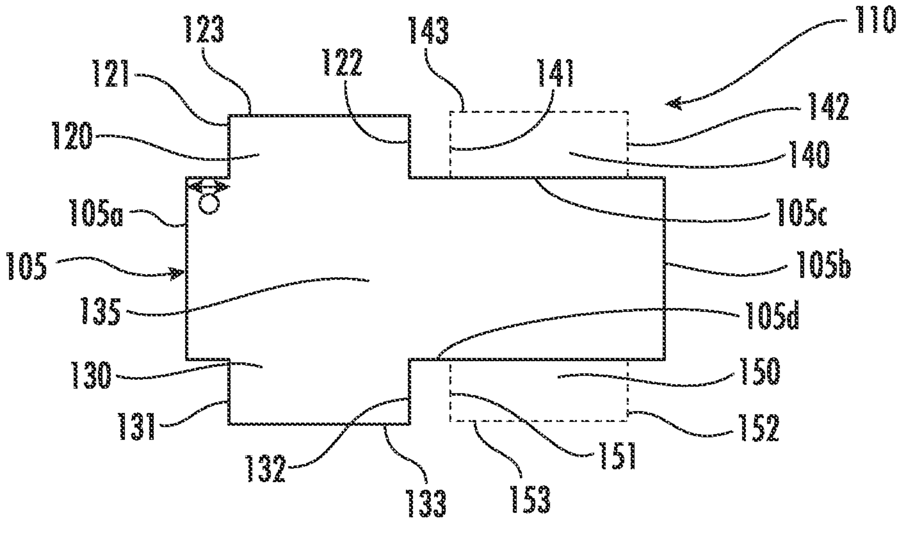
FIG. 5B illustrates a side view of the internal electrode layers of the capacitor of FIG. 5A.
Figures 5C, 5D:
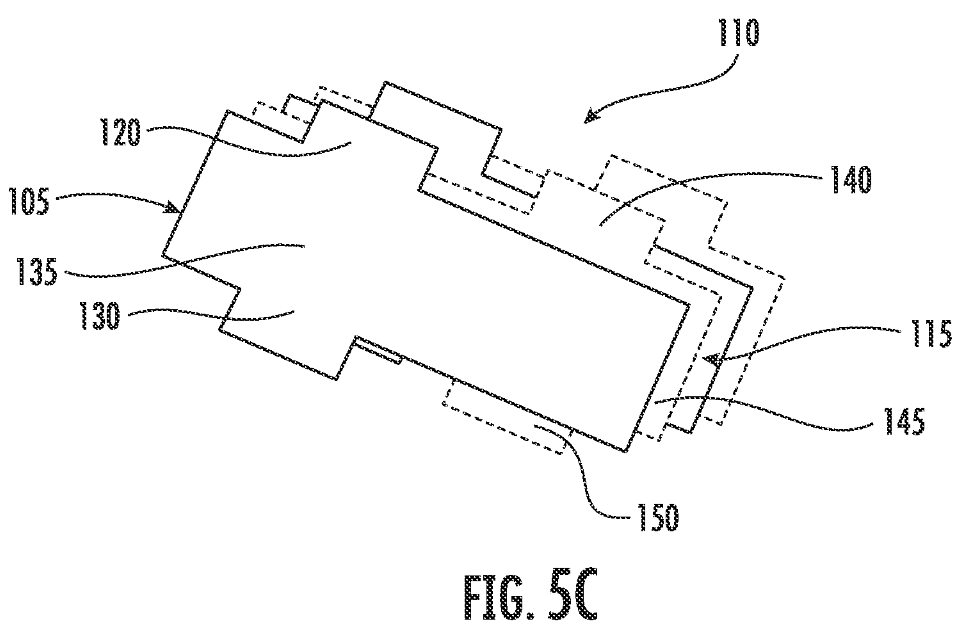
FIG. 5C illustrates a perspective view of the internal electrode layers of the capacitor of FIG. 5A.
FIG. 5D illustrates a cross-sectional perspective view of the capacitor of FIG. 5A.

As shown in FIG. 5D, multiple sets 110*a* and 110*b* of internal electrode layers 110 may be used to form the array of external terminals shown in FIG. 5A. Typically, the distance "t" between the sets 110*a* and 110*b* is from about 0.2 to about 10 μm, in some embodiments, from about 0.5 to about 8 μm, and in some embodiments, from about 1 to about 5 μm. Additionally, the distance "t" may be, while not limited, is at least 2 times, in some embodiments, at least about 3 times, and in embodiments, from about 4 to about 8 times greater than the distance between adjacent lead tabs in a given column to ensure that distinct terminations do not run together.

Referring to FIGS. 6A-6D, one embodiment of a capacitor 20 is shown that has a 2×4 array configuration. In such a configuration, the capacitor includes a total of eight external terminals on the upper surface (first external terminals 22*a*, 22*b* and second external terminals 24*a*, 24*b*) and a corresponding number of external terminals (third and fourth external terminals, not shown) on the lower surface. The first external terminals 22*a*, 22*b* and third external terminals (not shown) generally have the same polarity (i.e., positive), and the second external terminals 24*a*, 24*b* and fourth external terminals (not shown) also generally have the same polarity (i.e., negative). Although by no means required, voids 1350 may also be formed in the capacitor 20 between external terminals 22*a*, 22*b*, 24*a*, and/or 24*b* as described above.

Figure 6A:
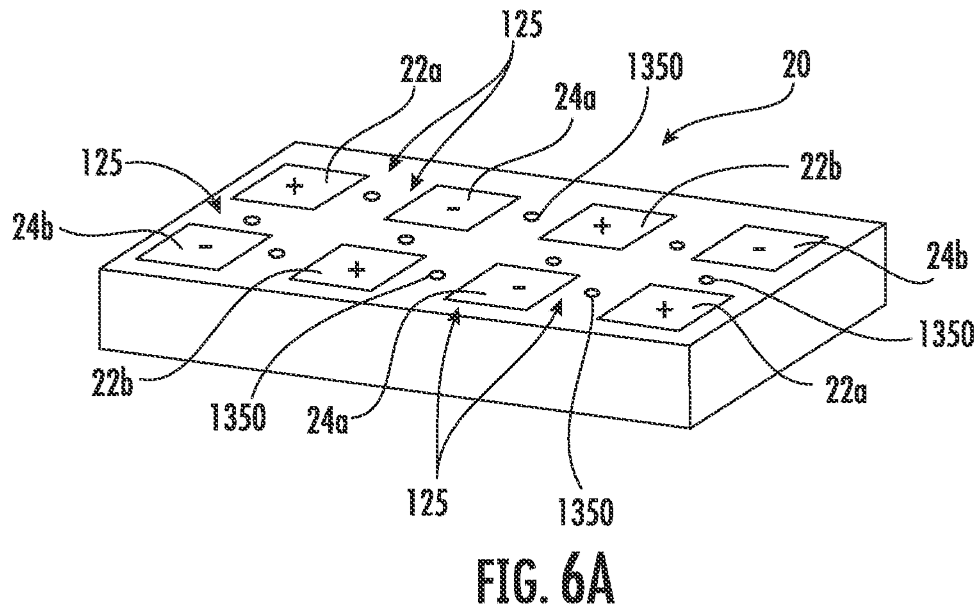
FIG. 6A illustrates a perspective view of another embodiment of a decoupling capacitor that may be employed in the present invention.
Figure 6B:
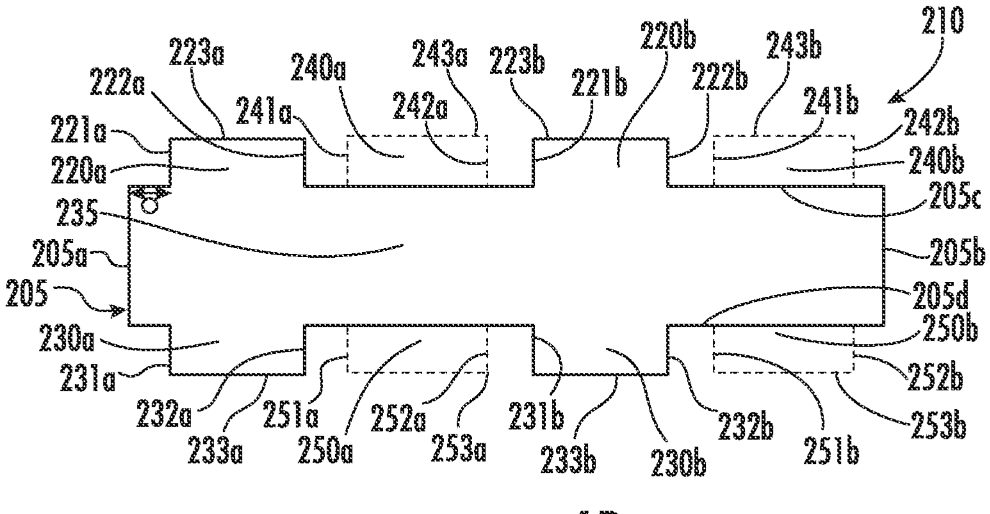
FIG. 6B illustrates a side view of the internal electrode layers of the capacitor of FIG. 6A.
Figure 6C:
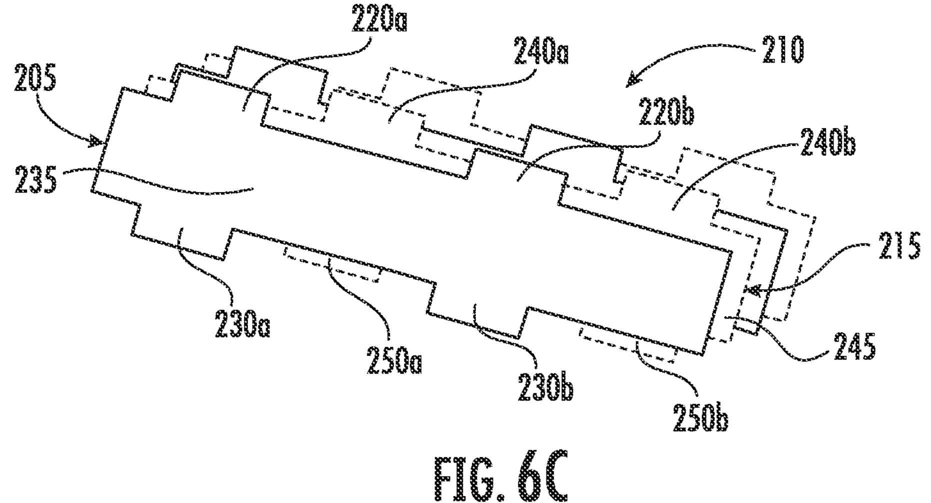
FIG. 6C illustrates a perspective view of the internal electrode layers of the capacitor of FIG. 6A.
Figure 6D:
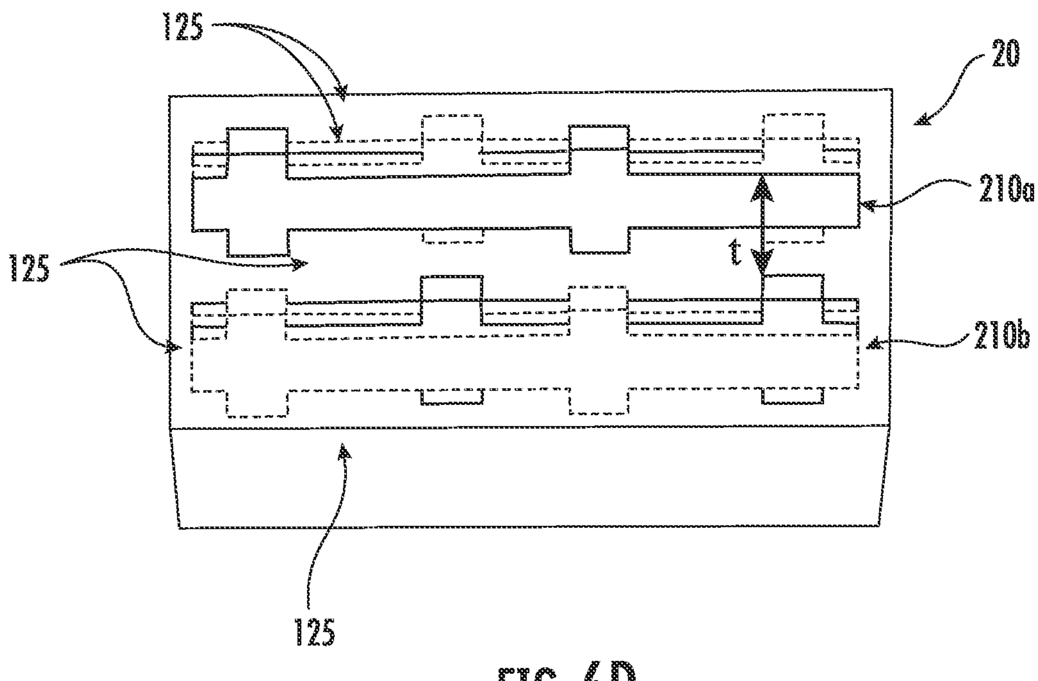
FIG. 6D illustrates a cross-sectional perspective view of the capacitor of FIG. 6A.

The capacitor 20 also includes two sets 210*a* and 210*b* of alternating internal electrode layers 210, as illustrated in FIG. 6D. As illustrated in FIGS. 6B and 6C, each set of alternating dielectric layers and internal electrode layers 210 includes first internal electrode layers 205 and second internal electrode layers 215 in an alternating arrangement. The internal electrode layers 205, 215 include at least one lead tab 220*a-b*, 230*a-b*, 240*a-b*, 250*a-b* extending from a top edge and a bottom edge of the main body of the internal electrode layers. The lead tabs 220*a-b*, 230*a-b*, 240*a-b*, 250*a-b* of the internal electrode layers 205, 215 extend to the upper surface and the lower surface of the capacitor and assist in forming the external terminals. In this regard, the lead tabs 220*a-b*, 230*a-b*, 240*a-b*, 250*a-b* may be exposed on the upper surface and the lower surface of the capacitor and allow for connection between the main body of the internal electrode layers and the external terminals. For instance, lead tabs 220*a-b*, 230*a-b*, 240*a-b*, 250*a-b* may contain leading edges 223*a-b*, 233*a-b*, 243*a-b*, 253*a-b* that extend to an edge of a dielectric layer and allows for formation of the external terminals. The internal electrode layers 205, 215 include at least two lead tabs 220*a-b*, 230*a-b*, 240*a-b*, 250*a-b* along a top edge and a bottom edge. A first internal electrode layer 205 includes two lead tabs 220*a-b*, 230*a-b* along each top edge 205*c* and bottom edge 205*d* and extending from main body 235. A second internal electrode layer 215 includes two lead tabs 240*a-b*, 250*a-b* along each top edge bottom edge and extending from main body 235.

The lead tabs 220*a-b*, 230*a-b* on the top edge 205*c* and the bottom edge 205*d* of first internal electrode layer 205 may be aligned in the vertical direction. That is, a lateral edge 221*a*, 222*a* of a first lead tab 220 along a top edge 205*c* may be aligned with a lateral edge 231*a*, 232*a* of a first lead tab 230 along a bottom edge 205*d* opposite the top edge 205*c*. In other words, a lateral edge 221*a*, 222*a* of a first lead tab 220 along a top edge 205*c* may be offset (indicated by "O") from a side edge 205*a-b* the same distance as a lateral edge 231*a*, 232*a* of a first lead tab 230 along a bottom edge 205*d* opposite the top edge 205*c*. Also, both lateral edges 221*a*, 222*a* of the first lead tab 220 along a top edge 205*c* may be aligned with the lateral edges 231*a*, 232*a* of a first lead tab 230 along a bottom edge 205*d* opposite the top edge 205*c*. That is, both lateral edges may be offset from a side edge 205*a-b* the same distance. When a top edge 205*c* and a bottom edge 205*d* contain at least two lead tabs 220*a-b*, 230*a-b*, at least one lateral edge of each lead tab on a top edge 205*c* may be aligned with a corresponding lateral edge of a lead tab on the bottom edge 205*d*. Also, both lateral edges of each lead tab on a top edge 205*c* may be aligned with corresponding lateral edges of the lead tabs on the bottom edge 205*d*.

Similarly, the lead tabs 240*a-b*, 250*a-b* on the top edge and the bottom edge of second internal electrode layer 215 may be aligned in the vertical direction. That is, a lateral edge 241*a*, 242*a* of a first lead tab 240*a* along a top edge may be aligned with a lateral edge 251*a*, 252*a* of a first lead tab 250*a* along a bottom edge opposite the top edge. Both lateral edges 241*a*, 242*a* of the first lead tab 240*a* along a top edge may be aligned with the lateral edges 251*a*, 252*a* of a first lead tab 250*a* along a bottom edge opposite the top edge. The relationship between lateral edges of a first lead tab on a top edge and a first lead tab on a bottom edge as mentioned with respect to internal electrode layer 205 may also apply to internal electrode layer 215. With such arrangement, a gap may be formed between any of the lead tabs along a top edge 205*c* of first internal electrode layer 205, of second internal electrode layer 215, or both. For instance, a gap may be formed between any of lead tabs 220*a-b*, 240*a-b* that extend from the top edges of the respective internal electrode layers. Additionally, a gap may be formed between any of the lead tabs along a bottom edge 205*d* of first internal electrode layer 205, of second internal electrode layer 215, or both. For instance, a gap may be formed between any of lead tabs 230*a-b*, 250*a-b* that extend from the bottom edges of the respective internal electrode layers. Also, the size of a gap between two respective tabs that extend from a top edge, whether from the same internal electrode layer or adjacent internal electrode layers, may be substantially the same as the size of a gap between the corresponding two respective tabs that extend from a bottom edge. For example, the gap between lead tabs 220*a* and 220*b* may be substantially the same as the gap between lead tabs 230*a* and 230*b*. Similarly, the gap between lead tabs 220*a* and 240*a* may be substantially the same as the gap between lead tabs 230 and 250*a*.

Any or all of lead tabs 220*a-b*, 240*a-b* may be arranged in parallel with lead tabs 230*a-b*, 250*a-b*, respectively, extending from the layers 205 and 215 such that the lead extending from alternating electrode layers 205 and 215 may be aligned in a respective column. For instance, lead tabs 220*a-b* and 230*a-b* of internal electrode layer 205 may be arranged in a respective stacked configuration while lead tabs 240*a-b* and 250*a-b* of internal electrode layer 215 may be arranged in a respective stacked configuration. It will be appreciated that lead tabs 220*a-b* connect to external terminals 22*a-b*, respectively, while lead tabs 240*a-b* connect to external terminal 24*a-b*, respectively. Accordingly, respective lead tabs 220*a-b* will be interdigitated with respective lead tabs 240*a-b*, respectively, in a manner similar to external terminals 22*a-b* and 24*a-b*. The interdigitated lead tabs can provide multiple, adjacent current injection points onto the associated main electrode portions.

As shown in FIG. 6D, multiple sets 210*a* and 210*b* of internal electrode layers 110 may be used to form the array of external terminals shown in FIG. 6A. Typically, the distance "t" between the sets 110*a* and 110*b* is from about 0.2 to about 10 μm, in some embodiments, from about 0.5 to about 8 μm, and in some embodiments, from about 1 to about 5 μm. Additionally, the distance "t" may be, while not limited, is at least 2 times, in some embodiments, at least about 3 times, and in embodiments, from about 4 to about 8 times greater than the distance between adjacent lead tabs in a given column to ensure that distinct terminations do not run together.

Figure 7A:
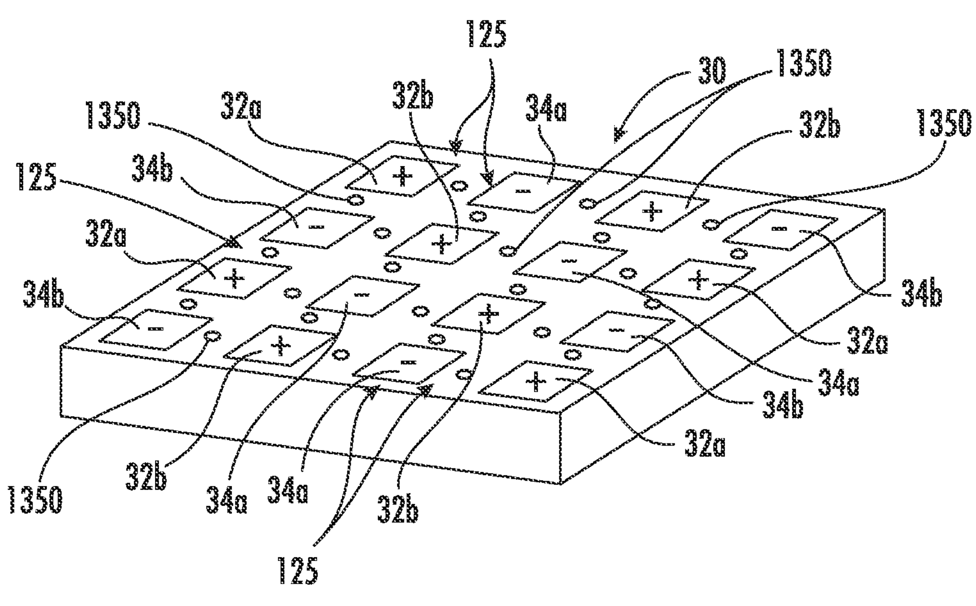
FIG. 7A illustrates a perspective view of another embodiment of a decoupling capacitor that may be employed in the present invention.
Figure 7B:
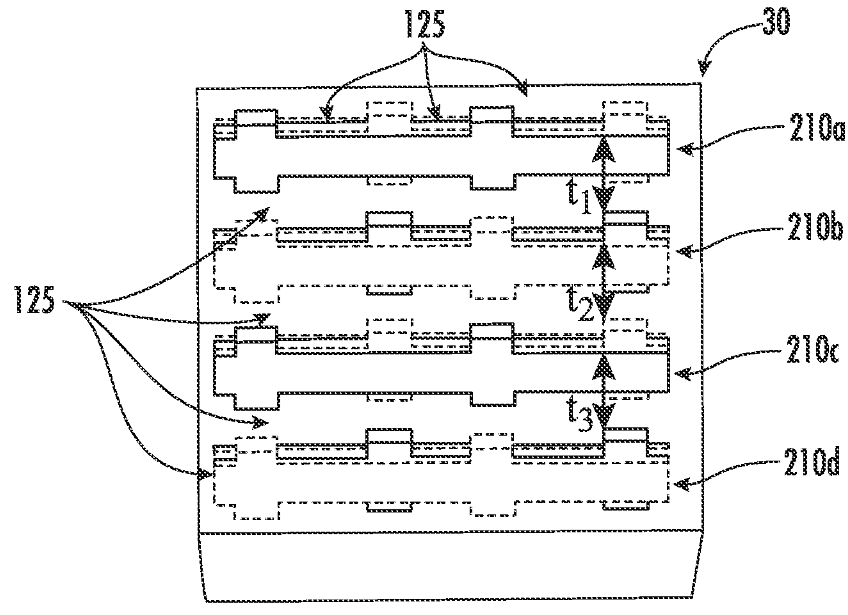
FIG. 7B illustrates a cross-sectional perspective view of the capacitor of FIG. 7A.

Referring to FIGS. 7A-7B, one embodiment of a capacitor 30 is shown that has a 4×4 array configuration. In such a configuration, the capacitor includes a total of sixteen external terminals on the upper surface (first external terminals 32*a*, 32*b* and second external terminals 34*a*, 34*b*) and a corresponding number of external terminals (third and fourth external terminals, not shown) on the lower surface. The first external terminals 32*a*, 32*b* and third external terminals (not shown) generally have the same polarity (i.e., positive), and the second external terminals 34*a*, 34*b* and fourth external terminals (not shown) also generally have the same polarity (i.e., negative). Although by no means required, voids 1350 may also be formed in the capacitor 30 between external terminals 32*a*, 32*b*, 34*a*, and/or 34*b* as described above. The capacitor 30 also contains internal electrode layers 210 arranged in four sets 210*a*, 210*b*, 210*c*, and 210*d*, as illustrated in FIG. 7B. Similar to the embodiments discussed above, the distances "$t_1$", "$t_2$", and/or "$t_3$" between the sets may be from about 0.2 to about 10 μm, in some embodiments, from about 0.5 to about 8 μm, and in some embodiments, from about 1 to about 5 μm. Additionally, the distances "$t_1$", "$t_2$", and/or "$t_3$" may be, while not limited, at least 2 times, in some embodiments, at least about 3 times, and in embodiments, from about 4 to about 8 times greater than the distance between adjacent lead tabs in a given column to ensure that distinct terminations do not run together.

In the embodiments referenced above, the internal electrode layers are generally oriented in a vertical configuration. Of course, this is by no means required and it is equally suitable to use other geometric configurations, such as a horizontal configuration. Referring to FIGS. 8A-8C, for example, a capacitor 20 is shown that has a 4×4 configuration of external terminals 32 and 34 similar to FIGS. 7A-7B, but that employs a horizontal internal electrode configuration. Namely, as shown in FIGS. 8B-8C, the capacitor 20 includes a plurality of internal electrode layers 205 and 215 and a plurality of dielectric layers in an alternate arrangement wherein the electrode layers are interleaved in an opposed and spaced apart relation with a dielectric layer located between each adjacent electrode layer. The internal electrode layers are electrically connected to an external terminal through conductive vias, such as a first conductive via 225 and a second conductive via 285. The conductive vias extend to an upper surface 235 of the capacitor and a lower surface 245 of the capacitor. In this regard, the conductive vias may be exposed on the upper surface 235 of the capacitor and the lower surface 245 of the capacitor. The exposure can assist in the formation of the external terminals on the upper surface 235 and the lower surface 245 of the capacitor. Furthermore, the internal electrode layers 205 and 215 have a rectangular configuration and are provided such that they do not extend to a side surface of the capacitor.

If desired, the capacitor 20 may also include a first shield region 255 and a second shield region 265, and each of the shield regions may include one or more shield electrode layers 275. As shown, the shield regions are provided above and below the active electrode region and active electrode layers 205, 215. FIG. 8C likewise illustrates the use of a first anchor electrode 305 and a second anchor electrode 295. The first anchor electrode 305 is provided in the first active electrode layer 205 with the first active electrode. In this regard, the first active electrode is electrically connected to first conductive via 225 while the first anchor electrode is connected to second conductive via 285. Similarly, the second anchor electrode 295 is provided in the second active electrode layer 215 with the second active electrode. In this regard, the second active electrode is electrically connected to second conductive via 285 while the second anchor electrode is connected to first conductive via 225.

The first conductive via 225 extends through and electrically contacts the first plurality of internal electrode layers 205. However, the first conductive via 225 extends through a non-contact hole 105 wherein a gap 105 is formed between the first conductive via 225 and the electrodes of the second plurality of internal electrode layers 215. Such a gap 105 allows for insulation of the second plurality of internal electrode layers 215 from first conductive via 225. Similarly, the second conductive via 285 extends through and electrically contacts the second plurality of internal electrode layers 215. However, the second conductive via 285 extends through a non-contact hole wherein a gap 115 is formed between the second conductive via 285 and the electrodes of the first plurality of internal electrode layers 205. Such a gap 115 allows for insulation of the first plurality of internal electrode layers 205 from second conductive via 285. When anchor (or dummy) electrodes are present as illustrated FIG. 8C, such layers also include gaps 125 and 135. The first conductive via 225 extends through and electrically contacts the first plurality of internal electrode layers 205 and contacts second anchor tabs 295. However, the second anchor tab 295 is isolated from the active electrodes of the second plurality of internal electrode layers 215 via a gap 125 formed between the anchor tab 295 and active electrode 215. Such a gap 125 allows for insulation of the second plurality of internal electrode layers 215 from the second anchor tab 295 and first conductive via 225.

The dielectric layers of the decoupling capacitor described herein are typically formed from a ceramic material. The ceramic material may have a relatively high dielectric constant. For instance, the dielectric constant may be 3 or more, in some embodiments, from about 10 to about 20,000, in some embodiments, from about 50 to about 10,000, in some embodiments, from about 60 to about 9,000, and in some embodiments, from about 80 to about 8,000. Particularly suitable examples of ceramic materials having a high dielectric constant are those designated as NPO (COG) (up to about 100), X7R (from about 3,000 to about 7,000), X7S, Z5U, and/or Y5V based on standard classifications established by the Electronic Industries Alliance (EIA). Such materials may include a perovskite, such as barium titanate ceramic materials (e.g., barium titanate, barium-strontium titanate, barium calcium titanate, barium zirconate titanate, barium strontium zirconate titanate, barium calcium zirconate titanate, etc.), lead titanate ceramic materials (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments, from about 0.15 to about 0.65, and in some embodiments, from about from 0.25 to about 0.6. Other suitable barium titanate ceramic materials may include, for instance, $Ba_xCa_{1-x}TiO_3$ where x is from about 0.2 to about 0.8, and in some embodiments, from about 0.4 to about 0.6; barium calcium zirconium titanate ($BaCaZrTiO_3$); $A[B1_{1/3}B2_{2/3}]O_3$ materials where A is $Ba_xSr_{1-x}$ (x can be a value from 0 to 1), B1 is $Mg_yZn_{1-y}$ (y can be a value from 0 to 1), and B2 is $Ta_zNb_{1-z}$ (z can be a value from 0 to 1); and so forth. Other suitable ceramic materials may include, for instance, $Pb_xZr_{1-x}TiO_3$ ("PZT") where x ranges from about 0.05 to about 0.4; lead lanthanum zirconium titanate ("PLZT"); lead titanate ($PbTiO_3$); and so forth.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may include nickel or an alloy thereof. Likewise, the external terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof. The external terminals may have an average thickness of about 100 μm or less, in some embodiments, from about 1 μm to about 70 μm, and in some embodiments, from about 5 to about 50 μm.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth. The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated terminal. A plated terminal may be formed by techniques known in the art, such as electroless plating, electrolytic plating, or combinations thereof. When multiple layers are used to form an external terminal, the external terminal may include an electroplated layer and an electroless plated layer. For instance, electroless plating may first be employed to deposit an initial layer of material. The plating technique may then be switched to an electrochemical plating system which may allow for a faster buildup of material. When forming the plated terminals with either plating method, a leading edge of the lead tabs of the internal electrode layers that is exposed from the main body of the capacitor is subjected to a plating solution. By subjecting, in one embodiment, the capacitor may be dipped into the plating solution.

The plating solution used in a plating process may include a conductive material, such as a conductive metal. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper. Additionally, it should be understood that the plating solution may contain other additives as generally known in the art. For instance, the additives may include other organic additives and media that can assist in the plating process. Additionally, additives may be employed in order to employ the plating solution at a desired pH level. In one embodiment, resistance-reducing additives may be employed in the solutions to assist with complete plating coverage and bonding of the plating materials to the capacitor and exposed leading edges of the lead tabs of the internal electrode layers. The capacitor may be exposed, submersed, or dipped in the plating solution for a predetermined amount of time. The exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective internal electrode layers within a set of alternating dielectric layers and internal electrode layers.

The different between electrolytic plating and electroless plating is that electrolytic plating employs an electrical bias, such as by using an external power supply. The electrolytic plating solution may be subjected typically to a high current density range, for example, ten to fifteen amp/$ft^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the internal electrode layers.

Prior to submersing or subjecting the capacitor to a plating solution, various pre-treatment steps may be employed. Such steps may be conducted for a variety of purposes, including to catalyze, to accelerate, and/or to improve the adhesion of the plating materials to the leading edges of the lead tabs. Additionally, prior to plating or any other pretreatment steps, an initial cleaning step may be employed. This step may be employed to remove any oxide buildup that forms on the exposed lead tabs of the internal electrode layers. The cleaning step may be particularly helpful to assist in removing any buildup of nickel oxide when the internal electrodes or other conductive elements are formed of nickel. Component cleaning may be affected by full immersion in a pre-clean bath, such as one including an acid cleaner. In one embodiment, exposure may be for a predetermined time, such as on the order of about 10 minutes. Cleaning may also alternatively be affected by chemical polishing or harperizing steps.

In addition, a step to activate the exposed metallic leading edges of the lead tabs of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized and thus are not necessarily limited. Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating. Additionally, post-treatment steps after plating may also be employed as desired or necessary. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

Thus, as described above, the external terminals employed in the capacitor may contain at least one plated layer. In one embodiment, the external terminals may contain only one plating layer. However, it should be understood that the external terminals may comprise a plurality of plating layers. For instance, the external terminals may comprise a first plating layer and a second plating layer. In addition, the external terminals may also comprise a third plating layer. Furthermore, the materials of these plating layers may be any of the aforementioned and as generally known in the art. For instance, one plating layer, such as a first plating layer, may contain copper or an alloy thereof. Another plating layer, such as a second plating layer, may contain nickel or an alloy thereof. Alternatively, another plating layer, such as the second plating layer, may contain cooper or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, the initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper). The aforementioned second layer above the initial plating layer may correspond to a solder barrier layer, for example, a nickel-solder barrier layer. In some embodiments, the aforementioned layer may be formed by electroplating an additional layer of metal (e.g., nickel or copper) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may, in some embodiments, correspond to a conductive layer, such as plated Ni, Ni/Cr, Ag, Pd, Sn, Pb/Sn or other suitable plated solder. In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith. It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

IV. Microelectronic Assembly

The semiconductor structure, interposer, package substrate, and decoupling capacitor may generally be arranged on a circuit board in a variety of different configurations. Referring to FIG. 1, for instance, one embodiment of a microelectronic assembly 100 is shown that contains a first package 62 (e.g., top package) disposed adjacent to a second package 60 (e.g., lower package). The first package 62 may include first semiconductor structures 66, such as described above, which are electrically connected to a first package substrate 64. The first semiconductor structures 66 may, for instance, include a memory die, such as a Static Random Access Memory (SRAM) die, Dynamic Random Access Memory (DRAM) die, etc. The second package 60 may likewise contain second semiconductor structures 37, such as described above, which are electrically connected to a second package substrate 80. The second semiconductor structures 37 may, for instance, include logic device dies, such as logic transistors, Central Computing Unit (CPU) dies, Power Management Integrated Circuit (PMIC) dies, Transceiver (TRX) dies, etc. As shown, the second semiconductor structures 37 may be contained within a semiconductor layer 34 that contains both the active semiconductor structures 37, as well as a bulk semiconductor layer 35.

The first package 60 and the second package 62 may be electrically connected using first level coupling components 68 (e.g., solder balls or bumps). More particularly, the first package substrate 64 may contain an insulating material 65 within which conductive pathways (e.g., vias, metal plates, etc.) are formed for electrical contact with the coupling components 68 as shown in FIG. 1. In the illustrated embodiment, the second package 60 also contains an interposer 77. The interposer 77 may, for instance, include a buffer layer 24 that connects to the semiconductor layer 35 via an adhesive layer 36. The buffer layer 24 may likewise connect the interposer 77 to the first package substrate 64 via an adhesive layer 54 formed on exposed portions of the buffer layer 24, which can facilitate contact with the first level coupling components 68. If desired, the interposer 77 may also include an overmold material 42 may also be disposed over the second semiconductor structure 37. In such embodiments, conductive pathways 33 (e.g., vias) may be formed in the overmold material 42 for electrical connection to the first level coupling components 68. For example, the first coupling components 68 may extend through the buffer layer 24 and contact the conductive pathways 33 formed in the overmold material 42. The second package substrate 80 may also contain an insulating material 84 within which conductive pathways (e.g., vias, metal plates, etc.) are formed for electrical connection with the first level coupling components 68. In the illustrated embodiment, for example, the conductive pathways of the second package substrate 80 are in electrical contact with the conductive pathways 33 formed in the interposer 77, which are, in turn, in electrical contact with the first level coupling components 68. The second package 60 may also be electrically connected to a circuit board 800 through second level coupling components 48 (e.g., solder balls). Namely, the conductive pathways formed in the second package substrate 80 may provide electrical connection between the conductive pathways 33 and the second level coupling components 48.

If desired, the lower surface of the first package 62 (defined by the lower surface of the first package substrate 64) and the upper surface of the second package 60 (defined by the upper surface of the adhesive layer 54) may be spaced apart by a gap 70 such that the first package 62 and the second package 60 have a standoff distance S1. The distance S1 may, for instance range from about 1 μm to about 500 μm, in some embodiments, from about 5 μm to about 2000 μm, and in some embodiments, from about 10 μm to about 100 μm. Underfill (not shown) may optionally be disposed within the gap 70 to help seal the perimeter of the gap 70 while leaving a center part 70' generally unfilled. The underfill may flow into the gap 70 via guiding trenches 58, which may be deeper than the center portion 70' of the gap 70.

Notably, a decoupling capacitor 10 (see e.g., FIGS. 2A-2B) is also positioned between at least a portion of the second package substrate 80 and the circuit board 800. Although only one capacitor is shown, it should of course be understood that multiple decoupling capacitors may be employed between the substrate 80 and the circuit board 800. The external terminals of the decoupling capacitor(s) may be in respective electrical communication with current paths of the circuit board and may be connected to the circuit board using any method generally known in the art. For example, rather than solder balls 48, the decoupling capacitor 10 can be either directly electrically connected to the second package substrate 80 and circuit board 800, or at the very least, coupling components 702 (e.g., solder bumps or balls) can be employed that are smaller in size than the coupling components 48. The capacitor 10 can allow for an AC signal to pass through or be transmitted while generally blocking a DC signal. That is, it may be employed to block low frequency signals and transmit high frequency signals. In addition, by arranging the capacitor 10 in the manner shown, certain conductive pathways directly above the capacitor can be eliminated, thereby further improving performance. The use of a decoupling capacitor in such a manner can also allow for a substantial reduction in inductance. In particular, minimizing the distance or path for a ground connection can assist in reducing the inductance. For example, use of the decoupling capacitor may result in an inductance of about 1 nanohenry or less, in some embodiments, from about 25 femtohenries to about 900 picohenries, in some embodiments, from about 100 femtohenries to about 500 picohenries, and in some embodiments, from about 250 femtohenries to about 100 picohenries. The decoupling capacitor may also exhibit a low equivalent series resistance, such as about 100 mOhm or less, in some embodiments, from about 0.01 mOhm to about 50 mOhm, in some embodiments, from about 0.1 mOhm to about 40 mOhm, and in some embodiments, from about 0.5 mOhm to about 30 mOhm. The low inductance and/or equivalent series resistance can be achieved while still exhibiting a tailored capacitance value, such as from about 1 pF to about 1,000 μF, in some embodiments, from about 500 pF to about 500 μF, and in some embodiments, from about 1 μF to about 100 μF.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only and is not intended to limit the invention so further described in such appended claims.

What is claimed is:

1. A microelectronic assembly comprising:

a first package comprising a first semiconductor structure that is electrically connected to a first package substrate;

a second package that is electrically connected and disposed adjacent to the first package, wherein the second package comprises a second semiconductor structure that is electrically connected to a second package substrate;

a decoupling capacitor having a first surface and an opposing second surface, wherein the decoupling capacitor contains alternating dielectric layers and internal electrode layers, the internal electrode layers containing first internal electrode layers and second internal electrode layers, wherein the decoupling capacitor further contains a first external terminal that is electrically connected to the first internal electrode layers and disposed on the first surface of the decoupling capacitor, a second external terminal that is electrically connected to the first internal electrode layers and disposed on the second surface of the decoupling capacitor, a third external terminal that is electrically connected to the second internal electrode layers and disposed on the first surface of the decoupling capacitor, and a fourth external terminal that is electrically connected to the second internal electrode layers and disposed on the second surface of the decoupling capacitor, wherein the first external terminal and the third external terminal are electrically connected to the second package substrate; and a circuit board, wherein the second external terminal and the fourth external terminal of the decoupling capacitor are electrically connected to the circuit board.

2. The microelectronic assembly of claim 1, wherein the first semiconductor structure, the second semiconductor structure, or both include an integrated circuit device.

3. The microelectronic assembly of claim 2, wherein the integrated circuit device includes a memory device, logic device, processor device, or a combination thereof.

4. The microelectronic assembly of claim 1, wherein the first package contains multiple first semiconductor structures.

5. The microelectronic assembly of claim 4, wherein the second package contains multiple first semiconductor structures.

6. The microelectronic assembly of claim 1, wherein the first semiconductor structure is electrically connected to the first package substrate via one or more coupling components.

7. The microelectronic assembly of claim 6, wherein the first package substrate, the second package substrate, or both include an insulating material through which one or more conductive pathways are formed.

8. The microelectronic assembly of claim 7, wherein the insulating material includes an organic material, inorganic material, semiconductor material, or a combination thereof.

9. The microelectronic assembly of claim 7, wherein the first package substate, the second package substrate, or both include conductive pathways formed in the insulating material.

10. The microelectronic assembly of claim 1, wherein the first package and the second package are spaced apart by a standoff distance.

11. The microelectronic assembly of claim 1, wherein the first package and the second package are connected via one or more first level coupling components.

12. The microelectronic assembly of claim 11, wherein the second package contains an interposer positioned between the first package substrate and the second package substrate.

13. The microelectronic assembly of claim 12, wherein the interposer includes a semiconductor layer that includes an active layer and a bulk semiconductor layer, wherein the second semiconductor structure is contained within the active layer.

14. The microelectronic assembly of claim 13, wherein conductive pathways are formed in the interposer that electrically connect the first level coupling components to conductive pathways formed in the second package substrate.

15. The microelectronic assembly of claim 1, wherein the first and second external terminals have a positive polarity, and the third and fourth external terminals have a negative polarity.

16. The microelectronic assembly of claim 1, wherein at least one of the first, second, third, or fourth external terminals extend to an end surface of the capacitor.

17. The microelectronic assembly of claim 1, wherein the first, second, third, and fourth external terminals do not extend to an end surface of the decoupling capacitor.

18. The microelectronic assembly of claim 1, wherein the decoupling capacitor contains only the first external terminal and the third external terminal on the first surface, and only the second external terminal and the fourth external terminal on the second surface.

19. The microelectronic assembly of claim 1, wherein the decoupling capacitor contains at least four external terminals on the first surface and at least four external terminals on the second surface.

20. The microelectronic assembly of claim 19, wherein the external terminals are arranged in a linear fashion on the first surface and the second surface.

21. The microelectronic assembly of claim 19, wherein the external terminals are arranged in a multi-dimensional array on the first surface and the second surface.

22. The microelectronic assembly of claim 1, wherein the first and the second internal electrode layers are arranged vertically.

23. The microelectronic assembly of claim 22, wherein the first internal electrode layers contain lead tabs extending to the first surface for contact with the first external terminal and lead tabs extending to the second surface for contact with the third external terminal, and further wherein the second internal electrode layers contain lead tabs extending to the first surface for contact with the second external terminal and lead tabs extending to the second surface for contact with the fourth external terminal.

24. The microelectronic assembly of claim 1, wherein the first and the second internal electrode layers are arranged horizontally.

25. The microelectronic assembly of claim 24, wherein the first and the second internal electrode layers are connected to the first, second, third, and fourth external terminals through conductive vias.

26. The microelectronic assembly of claim 1, wherein the dielectric layers of the decoupling capacitor include a ceramic material.

27. The microelectronic assembly of claim 26, wherein the ceramic material is a barium titanate ceramic material.

28. The microelectronic assembly of claim 1, wherein the first, second, third, and fourth external terminals contain at least one plated layer.

29. The microelectronic assembly of claim 28, wherein the plated layer is formed by a process that includes electroless plating, electrolytic plating, or a combination thereof.

30. The microelectronic assembly of claim 1, wherein the circuit board is electrically connected to the second package substrate via coupling components.

31. The microelectronic assembly of claim 30, wherein the coupling components include solder.

32. The microelectronic assembly of claim 1, wherein the first and the third external terminals of the decoupling capacitor are electrically connected to the second package substrate via coupling components.

33. The microelectronic assembly of claim 1, wherein the second and the fourth external terminals of the decoupling capacitor are electrically connected to the circuit board via coupling components.

* * * * *